US010630067B2

United States Patent
Muramoto et al.

(10) Patent No.: US 10,630,067 B2
(45) Date of Patent: *Apr. 21, 2020

(54) SEMICONDUCTOR DEVICE AND BATTERY VOLTAGE MONITORING DEVICE

(71) Applicant: RENESAS ELECTRONICS CORPORATION, Tokyo (JP)

(72) Inventors: Yoshitaka Muramoto, Tokyo (JP); Junko Kimura, Tokyo (JP); Hirohiko Hayakawa, Itami (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 350 days.

This patent is subject to a terminal disclaimer.

(21) Appl. No.: 15/642,939

(22) Filed: Jul. 6, 2017

(65) Prior Publication Data

US 2017/0302069 A1    Oct. 19, 2017

Related U.S. Application Data

(63) Continuation of application No. 13/968,635, filed on Aug. 16, 2013, now Pat. No. 9,735,567.

(30) Foreign Application Priority Data

Aug. 24, 2012    (JP) .................................. 2012-185120

(51) Int. Cl.
 *H02H 7/18* (2006.01)
 *G01R 31/36* (2020.01)
 (Continued)

(52) U.S. Cl.
 CPC ........... *H02H 7/18* (2013.01); *G01R 31/3835* (2019.01); *G01R 31/396* (2019.01);
 (Continued)

(58) Field of Classification Search
 CPC .............. G01R 19/16542; G01R 31/36; G01R 31/3835; G01R 31/396; H02H 7/18;
 (Continued)

(56) References Cited

U.S. PATENT DOCUMENTS 7,417,438 B2    8/2008  Miyamoto
8,030,893 B2    10/2011 Nakatsuji
 (Continued)

FOREIGN PATENT DOCUMENTS

EP    1 122 854 A2    8/2001
EP    2 412 581 A1    2/2012
 (Continued)

OTHER PUBLICATIONS

Office Action with a dispatch date of Feb. 4, 2016, issued in related Japanese Application No. 2013-185120 (English Translation provided).

(Continued)

*Primary Examiner* — Thienvu V Tran
*Assistant Examiner* — Nicolas Bellido
(74) *Attorney, Agent, or Firm* — McDermott Will & Emery LLP

(57) ABSTRACT

A semiconductor device is provided for measuring a voltage of each of plural unit cells series-coupled in multi-stage and configuring an assembled battery. The semiconductor device includes two terminals coupled to two nodes which are electrodes of a unit cell and coupled with other unit cells, and a voltage measurement circuit which measures the inter-terminal voltage between the two terminals. The device also includes a down-convert level shifter circuit which converts the inter-terminal voltage into a low-potential-side inter-terminal voltage based on a ground potential, and a comparator circuit which compares the converted low-potential-side inter-terminal voltage with a predetermined ref- (Continued)

erence voltage. The semiconductor device further includes an up-convert level shifter circuit which converts a low-potential-side shunt control signal based on the ground potential into a high-potential-side shunt control signal, and a switch which short-circuits the two terminals via a resistor based on the converted high-potential-side shunt control signal.

4 Claims, 10 Drawing Sheets

(51) Int. Cl.
  *H02J 7/00* (2006.01)
  *G01R 19/165* (2006.01)
  *G01R 31/396* (2019.01)
  *G01R 31/3835* (2019.01)
(52) U.S. Cl.
  CPC .......... *H02J 7/0016* (2013.01); *H02J 7/0021* (2013.01); *G01R 19/16542* (2013.01)
(58) Field of Classification Search
  CPC .......... H02J 7/00; H02J 7/0011; H02J 7/0013; H02J 7/0014; H02J 7/0016; H02J 7/0018; H02J 7/0019; H02J 7/0021; H02J 7/0024; H02J 7/0026; H02M 2001/007; H02M 2001/0077; Y10T 307/685
  USPC ........................ 361/86; 320/118, 122; 307/77
  See application file for complete search history.

(56) References Cited

U.S. PATENT DOCUMENTS

| | | | |
|---|---|---|---|
| 8,330,469 B2 | 12/2012 | Miyamoto | |
| 9,735,567 B2 * | 8/2017 | Muramoto | ............... H02H 7/18 |
| 2008/0164881 A1 | 7/2008 | Miyamoto | |
| 2009/0284224 A1 | 11/2009 | Miyazaki et al. | |
| 2010/0271052 A1 * | 10/2010 | Ishikawa | ............... G01R 31/026 324/686 |
| 2012/0206105 A1 | 8/2012 | Nishizawa et al. | |
| 2012/0306451 A1 | 12/2012 | Arai | |
| 2013/0026994 A1 * | 1/2013 | Morikawa | ........... H01M 10/425 320/134 |
| 2013/0162213 A1 | 6/2013 | Izawa | |
| 2014/0055896 A1 * | 2/2014 | Muramoto | ............... H02H 7/18 361/86 |
| 2017/0302069 A1 * | 10/2017 | Muramoto | ............... H02H 7/18 |

FOREIGN PATENT DOCUMENTS

| | | |
|---|---|---|
| JP | 2006-064639 A | 3/2006 |
| JP | 2006-185685 A | 7/2006 |
| JP | 2006-275928 A | 10/2006 |
| JP | 2008-164567 A | 7/2008 |
| JP | 2012-23848 A | 2/2012 |
| WO | 2007/119682 A1 | 10/2007 |
| WO | 2011/105309 A1 | 9/2011 |

OTHER PUBLICATIONS

Extended European Search Report issued in corresponding European Patent Application No. 13179215.2, dated Apr. 12, 2017.
Non-Final Office Action issued in U.S. Appl. No. 13/968,635, dated Dec. 2, 2015.
Final Office Action issued in U.S. Appl. No. 13/968,635, dated Jun. 2, 2016.
Non-Final Office Action issued in U.S. Appl. No. 13/968,635, dated Dec. 20, 2016.
Notice of Allowance issued in U.S. Appl. No. 13/968,635, dated Apr. 7, 2017.

* cited by examiner

SEPARATED DRAIN TYPE

SEPARATED DISCHARGE PATH TYPE

SEPARATED DRAIN/SOURCE TYPE

SEMICONDUCTOR DEVICE AND BATTERY VOLTAGE MONITORING DEVICE

CROSS-REFERENCE TO RELATED APPLICATIONS

This application is a Continuation application of U.S. patent application Ser. No. 13/968,635, filed on Aug. 16, 2013, which in turn claims the benefit of Japanese Patent Application No. 2012-185120 filed on Aug. 24, 2012, the entire disclosures of which Applications are incorporated by reference herein.

BACKGROUND

The present invention relates to a device which measures a voltage of each of plural voltage supplies coupled in series and collects the measurement results, and, in particular, the present invention can be utilized suitably for a semiconductor device which configures the device.

Currently, an electric vehicle which employs a motor as a driving source for traveling of the vehicle is developed by not only automakers but other companies or groups. In order to drive a motor, an in-vehicle power supply which produces a high voltage of several hundred volts is required. This power source is realized by a battery system comprised of a series coupling of many unit cells (battery cells) each of which produces a voltage of several volts. Such a battery system needs to measure the voltage of each of plural unit cells coupled in series with high accuracy, in order to determine the state of the battery (for example, an overcharge state, an overdischarge state, the remaining amount of charge) under all environments including at the time of traveling and electric charging of a vehicle. A battery system may incur serious risks, such as ignition and explosion, at the time of occurrence of abnormal conditions; therefore, in order to operate the battery system safely, a fail-safe solution is adopted in the voltage measurement device.

A battery control system is usually comprised of a supervisory IC (Integrated Circuit), a fault monitor IC (secondary protection IC), an MCU (Micro Controller Unit), and others. The supervisory IC monitors the state of a battery cell and outputs state data (mainly battery voltage). The supervisory IC is provided with an analog-to-digital converter circuit (ADC), measures the battery voltage of a unit cell to an accuracy of about 5 mV, and outputs the measurement result in response to an instruction from the MCU. The fault monitor IC monitors the voltage of a battery cell and outputs an abnormality detection signal when the monitored voltage deviates from a predetermined voltage range. In the case of a lithium-ion battery, for example, the fault monitor IC outputs an abnormality detection signal, noting that it is an overdischarge state when the unit cell voltage becomes less than 2V, and outputs an abnormality detection signal, noting that it is an overcharge state when the unit cell voltage becomes greater than 4.5V. The MCU controls the supervisory IC and the secondary protection IC, and at the same time, controls the entire battery control system on the basis of the outputs of the supervisory IC and the fault monitor IC. The MCU summarizes the state data outputted from the supervisory IC in real time, and performs suitable control on the basis of the state data.

In particular, severe functional safety standards are applied to a vehicle electronic control system. In order to fulfill these severe standards, many kinds of diagnosis function are provided in the battery control system. The examples include the detection function of disconnection between a node of unit cells of an assembled battery and a terminal of the supervisory IC, and self-diagnosis function of each blocks, such as ADC, etc. The fault monitor IC which can detect an overcharge state and an overdischarge state is frequently employed for realizing such functional safety.

On the other hand, the reduction in cost is also strongly demanded for the battery control system. For that purpose, it is assumed to be better to integrate the supervisory IC and the fault monitor IC on a single semiconductor chip. When the fault monitor IC is employed for realization of the functional safety, it is desirable to perform the integration with the function maintained.

Patent Literature 1 discloses the technique of adding to a supervisory IC the function capable of detecting disconnection between a node of unit cells in an assembled battery and a terminal of the supervisory IC. The disconnection is detected by observing a voltage drop which occurs at the time when the node and the ground is selectively short-circuited with a resistor and a switch. The measurement of the voltage drop is performed by utilizing an ADC provided in the supervisory IC for measurement of the cell voltage as the original function.

Patent Literature 2 realizes the function of detecting disconnection between a node of unit cells in an assembled battery and a terminal of a supervisory IC, by employing an overvoltage detection comparator and a low-voltage detection comparator. In the normal operation without disconnection, the overvoltage detection comparator determines that an abnormality is detected when a cell voltage becomes greater than a predetermined value, and the low-voltage detection comparator determines that an abnormality is detected when a cell voltage becomes less than a predetermined value. Patent Literature 2 points out that "when disconnection occurs in the voltage measurement wiring, it is important to detect the disconnection immediately and to take fail-safe action" (Paragragh 0004).

Patent Literature 3 discloses an invention which has improved the invention disclosed by Patent Literature 2. Patent Literature 3 solves an issue that an output of a voltage sensor module is accidentally outputted due to disconnection of wiring, thereby causing an unstable output as a battery voltage monitoring device.

Patent Literature 4 discloses a battery voltage monitoring device which can check whether a comparator for monitoring the occurrence of an overcharge state or an overdischarge state is working properly, in the state where the voltage of each battery cell configuring an assembled battery is in the normal voltage range.

PATENT LITERATURE (Patent Literature 1) International Publication WO 2007/119682
(Patent Literature 2) Published Japanese Unexamined Patent Application No. 2006-275928
(Patent Literature 3) Published Japanese Unexamined Patent Application No. 2008-164567
(Patent Literature 4) Published Japanese Unexamined Patent Application No. 2006-64639

SUMMARY

The examination performed by the present inventors on Patent Literature 1, 2, 3, and 4 has revealed that there exists the following new issue.

In the technique disclosed by Patent Literature 1, the supervisory IC detects disconnection between a node of unit cells in an assembled battery and a terminal of the supervisory IC by employing an ADC provided for the measurement of the cell voltage as the original function. Therefore, the measurement system and the fault detection system are not independent (not dual-redundant). Accordingly, it is difficult to satisfy the functional safety standards only with the disclosed technique. Patent Literature 1 describes simultaneous use of a double protection IC as a premise.

The technique disclosed by Patent Literature 2 and 3 is the technique of additionally imparting the function of detecting disconnection between a node of unit cells in the assembled battery and a terminal of the supervisory IC, to the overcharge/overdischarge detection circuit provided in the fault monitor IC, and is independent of the supervisory IC (dual-redundant). Therefore, the functional safety standards can be satisfied. However, the supervisory IC and the fault monitor IC are mounted in separate chips, and neither description nor suggestion is made about their integration in a single semiconductor chip. As illustrated in FIG. 1 of Patent Literature 1, for example, an overvoltage detection comparator and a low-voltage detection comparator are provided in each of unit battery cells, and no consideration is taken about integration onto a single semiconductor substrate. Comparator circuits coupled to battery cells series-coupled in multi-stage operate with respectively different potential, and the potential difference between a comparator circuit of the highest potential and a comparator circuit of the lowest potential may amount to several hundred volts. In that case, it is necessary to insulate each comparator circuit coupled to each battery cell from other battery cells; accordingly, it is necessary to adopt multi-well structure in a CMOS process, for example. Even if the multi-well structure is adopted, it is necessary to provide a broad insulating region in order to make a withstand voltage high; therefore, the burden with respect to cost is heavy.

Patent Literature 4 discloses the technique in which the potential of a node of unit cells is converted by level shifter circuits 12-14 and transmitted to a comparator circuit, as illustrated in FIG. 1 for example. However, any concrete realization method of the level shifter circuit is not disclosed. The technique disclosed by Patent Literature 4 relates to a failure detection circuit of a comparator which performs overcharge/overdischarge detection; however, there is no reference to the function of detecting disconnection between a node of unit cells and a terminal of the supervisory IC, and, furthermore, there is neither description nor suggestion about integration with the supervisory IC.

There are various issues to be solved as described above, in realizing the measurement of a battery voltage as well as the detection of overcharge/overdischarge and disconnection between a node of unit cells and a terminal as the function of fault monitoring in a circuit formed on a single semiconductor substrate, while satisfying the functional safety standards with dual-redundancy of the function of battery voltage monitoring and fault monitoring.

A solution to such issues will be explained in the following. The other issues and new features of the present invention will become clear from the description of the present specification and the accompanying drawings.

According to one embodiment, the solution is as follows.

That is, a semiconductor device for measuring voltage of each of plural unit cells series-coupled in multi-stage and configuring an assembled battery is configured as follows. The semiconductor device is provided with two terminals to be coupled to two nodes which are both electrodes of a unit cell and coupled with other unit cells, and a voltage measurement circuit which measures an inter-terminal voltage between the two terminals. The semiconductor device is further provided with a down-convert level shifter circuit which converts the inter-terminal voltage into a low-potential-side inter-terminal voltage on the basis of a ground potential, and a comparator circuit which compares the converted low-potential-side inter-terminal voltage with a predetermined reference voltage. The semiconductor device is also provided with an up-convert level shifter circuit which converts the low-potential-side shunt control signal on the basis of the ground potential into a high-potential-side shunt control signal, and a switch which short-circuits the two terminals via a resistor on the basis of the converted high-potential-side shunt control signal.

The effect obtained by the one embodiment will be explained briefly as follows.

That is, it is possible to realize the measurement of a battery voltage as well as the detection of overcharge/overdischarge and disconnection between a node of unit cells and a terminal as the function of fault monitoring, in a circuit formed on a single semiconductor substrate, while satisfying the functional safety standards with dual-redundancy of the function of battery voltage monitoring and fault monitoring.

DETAILED DESCRIPTION

1. Outline of Embodiments

Figure 1:
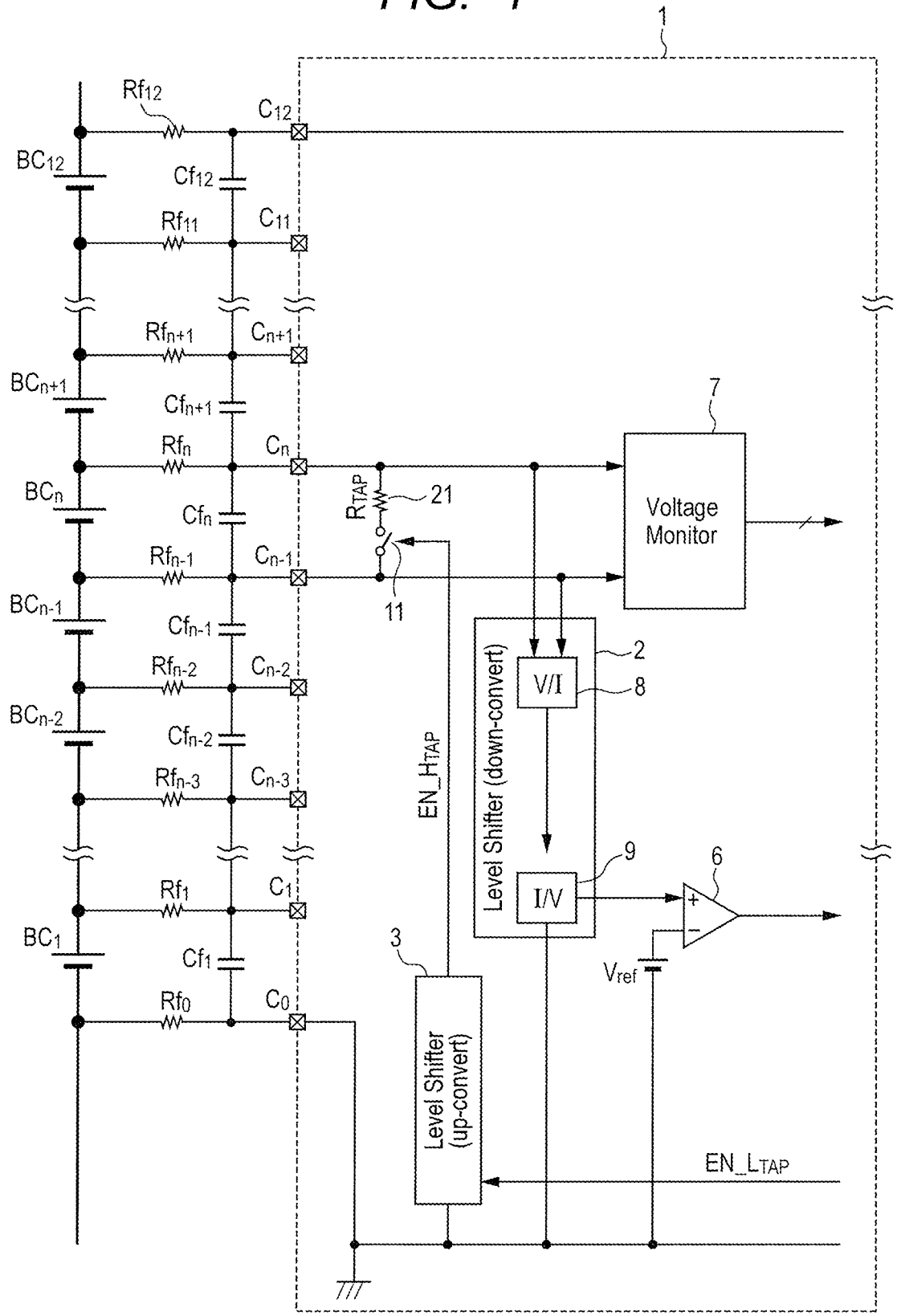
FIG. 1 is a drawing illustrating a configuration of principal parts of a battery voltage monitoring IC according to Embodiment 1.

First, an outline of a typical embodiment of the invention disclosed in the present application is explained. A numerical symbol of the drawing referred to in parentheses in the outline explanation about the typical embodiment only illustrates what is included in the concept of the component to which the numerical symbol is attached.

(1) <Tap Disengagement Detection+Overcharge/Overdischarge Detection+Cell Voltage Measurement>

A semiconductor device (1) for measuring voltage of each of plural unit cells series-coupled in multi-stage and configuring an assembled battery is comprised of the following elements.

A first terminal ($C_n$) to be coupled to a first node which is one electrode of a unit cell and coupled to another unit cell in the unit cells, and a second terminal ($C_{n-1}$) to be coupled to a second node which is the other electrode of the unit cell and coupled to another unit cell.

A voltage measurement circuit (7) which measures an inter-terminal voltage between the first terminal and the second terminal.

A first level shifter circuit (2) which converts the inter-terminal voltage into a low-potential-side inter-terminal voltage.

A comparator circuit (6) which compares the low-potential-side inter-terminal voltage with a predetermined reference voltage ($V_{ref}$).

A second level shifter circuit (3) which converts a low-potential-side shunt control signal (EN_$L_{TAP}$) into a high-potential-side shunt control signal (EN_$H_{TAP}$).

A first switch (11) which short-circuits the first terminal and the second terminal via a first resistor (21), on the basis of the high-potential-side shunt control signal.

According to the present structure, while satisfying the functional safety standards with dual-redundancy of the function of battery voltage monitoring and fault monitoring, it is possible to realize the measurement of a battery voltage as well as the detection of overcharge/overdischarge and disconnection between a node of unit cells and a terminal as the function of fault monitoring, in a circuit formed on a single semiconductor substrate.

(2) <Fault Detection of a Cell Balance Switch (a Separated Drain Type)>

In Paragraph 1, the semiconductor device is comprised of the following elements.

A third terminal ($B_n$) to be coupled to the first node.

A second resistor (22) coupled between the first terminal and the third terminal.

A third level shifter circuit (4) which converts a low-potential-side sense enable signal (EN_$L_{MON}$) into a high-potential-side sense enable signal (EN_$H_{MON}$).

A fourth level shifter circuit (5) which converts a low-potential-side cell balance enable signal (EN_$L_{CB}$) into a high-potential-side cell balance enable signal (EN_$H_{CB}$).

A third switch (12) which short-circuits the third terminal and the second terminal, on the basis of the high-potential-side cell balance enable signal.

At this time, the first level shifter circuit is provided with a voltage-to-current converter circuit (8) which converts the inter-terminal voltage into a current value corresponding to the inter-terminal voltage, and a current-to-voltage converter circuit (9) which converts the current value into a low-potential-side inter-terminal voltage corresponding to the current value. The first level shifter circuit is also provided with a second switch (13) which controls operation of the voltage-to-current converter circuit, on the basis of the high-potential-side sense enable signal, and a fourth switch (14) which controls operation of the voltage-to-current converter circuit, on the basis of the potential of the third terminal, in parallel with the second switch.

According to the present structure, it is possible to realize, with a circuit formed on a single semiconductor substrate, the fault detection of the switch (12) which discharges a unit cell in order to realize the cell balance function (function to correct the imbalance of the voltage among plural unit cells), while satisfying the functional safety standards with dual-redundancy with the monitoring of a battery voltage.

(3) <Fault Detection of a Cell Balance Switch (a Separated Discharge Path Type, a Separated Drain/Source Type)>

In Paragraph 1, the semiconductor device is comprised of the following elements.

A third terminal ($B_n$, $BD_n$) to be coupled to the first node and a fourth terminal ($B_{n-1}$, $BS_n$) to be coupled to the second node.

A second resistor (22) coupled between the first terminal and the third terminal.

A third level shifter circuit (4) which converts a low-potential-side sense enable signal (EN_$L_{MON}$) into a high-potential-side sense enable signal (EN_$H_{MON}$).

A fourth level shifter circuit (5) which converts a low-potential-side cell balance enable signal (EN_$L_{CB}$) into a high-potential-side cell balance enable signal (EN_$H_{CB}$).

A fifth switch (15, 16) which short-circuits the third terminal and the fourth terminal, on the basis of the high-potential-side cell balance enable signal.

At this time, the first level shifter circuit is provided with a voltage-to-current converter circuit (8) which converts the inter-terminal voltage into a current value corresponding to the inter-terminal voltage, and a current-to-voltage converter circuit (9) which converts the current value into a low-potential-side inter-terminal voltage corresponding to the current value. The semiconductor device (1) is provided with a second switch (13) which controls operation of the voltage-to-current converter circuit, on the basis of the high-potential-side sense enable signal, and a fourth switch (14) which controls operation of the voltage-to-current converter circuit, on the basis of the potential of the third terminal, in parallel with the second switch.

According to the present structure, with a circuit formed in a single semiconductor substrate, it is possible to realize the fault detection of the switch (15, 16) which discharges a unit cell in order to realize the cell balance function, while satisfying the functional safety standards with dual-redundancy with the monitoring of a battery voltage.

(4) <A Down-Convert Level Shifter Circuit by Use of a High Withstand Voltage FET>

In Paragraph 2 or Paragraph 3, the voltage-to-current converter circuit and the current-to-voltage converter circuit are configured as follows, respectively.

The voltage-to-current converter circuit is comprised of a third resistor (23), and a first high withstand voltage FET (31). A gate of the first high withstand voltage FET is coupled to the second terminal, and the second switch and the third resistor are coupled in series between the source of the first high withstand voltage FET and the first terminal. A conversion current of a current value corresponding to the inter-terminal voltage is outputted to a drain of the first high withstand voltage FET.

The current-to-voltage converter circuit is comprised of a fourth resistor (24) and a second high withstand voltage FET. The fourth resistor is coupled in series with a diode formed between a drain and a short-circuited gate-and-source of the second high withstand voltage FET, and the current-to-voltage converter circuit converts the inputted conversion current into the low-potential-side inter-terminal voltage corresponding to the current value, and outputs the voltage.

According to the present structure, it is possible to configure the down-convert level shifter with a high withstand voltage FET.

(5) <A Center-Tapped Down-Convert Level Shifter Circuit by Use of a High Withstand Voltage FET>

In Paragraph 4, the semiconductor device is provided with a fifth terminal ($C_{n-3}$) to be coupled to a third node which is one electrode of a unit cell different from the unit cell and is coupled to another unit cell in the plural unit cells. The first level shifter circuit is provided with a third high withstand voltage FET (33), a gate of the third high withstand voltage FET is coupled to the fifth terminal, and a drain and a source of the third high withstand voltage FET are inserted in a signal line which transmits the conversion current between the voltage-to-current converter circuit and the current-to-voltage converter circuit.

According to the present structure, it is possible to configure the down-convert level shifter by use of a high withstand voltage FET of a withstand voltage lower than the voltage of the assembled battery.

(6) <A Down-Convert Level Shifter Circuit by Use of a High Withstand Voltage Bipolar Transistor>

In Paragraph 2 or Paragraph 3, the voltage-to-current converter circuit and the current-to-voltage converter circuit are configured as follows, respectively.

The voltage-to-current converter circuit is comprised of a third resistor (23) and a first high withstand voltage bipolar transistor (41). A base of the first high withstand voltage bipolar transistor is coupled to the second terminal, the second switch and the third resistor are coupled in series between an emitter of the first high withstand voltage bipolar transistor and the first terminal, and a conversion current of a current value corresponding to the inter-terminal voltage is outputted to a collector of the first high withstand voltage bipolar transistor.

The current-to-voltage converter circuit is comprised of a fourth resistor (24) and a second high withstand voltage bipolar transistor (42). The fourth resistor is coupled in series with a diode formed between a collector and a short-circuited base-and-emitter of the second high withstand voltage bipolar transistor, and the current-to-voltage converter circuit converts the inputted conversion current into the low-potential-side inter-terminal voltage corresponding to the current value, and outputs the voltage.

According to the present structure, it is possible to configure the down-convert level shifter with a high withstand voltage bipolar transistor.

(7) <A Center-Tapped Down-Convert Level Shifter Circuit by Use of a High Withstand Voltage Bipolar Transistor>

In Paragraph 6, the semiconductor device is further provided with a fifth terminal ($C_{n-3}$) to be coupled to a third node which is one electrode of a unit cell different from the unit cell and is coupled to another unit cell in the plural unit cells. The first level shifter circuit is comprised of a third high withstand voltage bipolar transistor (43). A base of the third high withstand voltage bipolar transistor is coupled to the fifth terminal, and a collector and an emitter of the third high withstand voltage bipolar transistor are inserted in a signal line which transmits the conversion current between the voltage-to-current converter circuit and the current-to-voltage converter circuit.

According to the present structure, it is also possible to configure the down-convert level shifter with the high withstand voltage bipolar transistor of a withstand voltage lower than the voltage of the assembled battery.

(8) <An Up-Convert Level Shifter for Driving a pMOS Switch>

In Paragraph 1, Paragraph 2, or Paragraph 3, at least one of the second level shifter circuit, the third level shifter circuit, and the fourth level shifter circuit is a circuit which converts a low-potential-side control signal (EN_$L_{TAP}$, EN_$L_{CB}$, EN_$L_{MON}$) into a high-potential-side control signal (EN_$H_{TAP}$, EN_$H_{CB}$, EN_$H_{MON}$), and is configured as follows.

At least one of the second level shifter circuit, the third level shifter circuit, and the fourth level shifter circuit is provided with a first current mirror (51) which is supplied with a reference current ($I_{ref}$) and outputs a first current output at a predetermined magnification of the reference current, a first high-withstand voltage transistor (35, 45) which controls the first current output on the basis of the low-potential-side control signal and outputs a second current output, and a fifth resistor (26) which is coupled to a high-potential-side signal line and outputs the high-potential-side control signal produced by a flow of the second current output.

According to the present structure, it is possible to configure an up-convert level shifter which is appropriate to drive a switch (11, 12, 13) comprised of a p-channel MOSFET (30_8).

(9) <An Up-Convert Level Shifter for Driving an nMOS Switch>

In Paragraph 1, Paragraph 2, or Paragraph 3, at least one of the second level shifter circuit, the third level shifter circuit, and the fourth level shifter circuit is a circuit which converts a low-potential-side control signal (EN_$L_{TAP}$, EN_$L_{CB}$, EN_$L_{MON}$) into a high-potential-side control signal (EN_$H_{TAP}$, EN_$H_{CB}$, EN_$H_{MON}$), and is configured as follows.

At least one of the second level shifter circuit, the third level shifter circuit, and the fourth level shifter circuit is provided with a first current mirror (51) which is supplied with a reference current ($I_{ref}$) and outputs a first current output at a predetermined magnification of the reference current, a second high-withstand voltage transistor (34, 44) which controls the first current output on the basis of the low-potential-side control signal and outputs a second current output, a second current mirror (52, 53) which is supplied with the second current output and outputs a third current output at a predetermined magnification of the second current output, and a sixth resistor (25) which outputs the high-potential-side control signal produced by a flow of the third current output.

According to the present structure, it is possible to configure an up-convert level shifter which is appropriate to drive a switch (11, 12, 13) comprised of an n-channel MOSFET (30_7).

(10) <An Up-Convert Level Shifter for Driving a High-Potential-Side pMOS Switch and a Low Potential Side nMOS Switch>

In Paragraph 1, Paragraph 2, or Paragraph 3, at least one of the second level shifter circuit, the third level shifter circuit, and the fourth level shifter circuit is configured as follows.

At least one of the second level shifter circuit, the third level shifter circuit, and the fourth level shifter circuit converts the first low-potential-side control signal (EN_$L_{TAP}$, EN_$L_{CB}$, EN_$L_{MON}$) into the first high-potential-side control signal (EN_$H_{TAP}$, EN_$H_{CB}$, EN_$H_{MON}$), and the second low-potential-side control signal (EN_$L_{TAP}$, EN_L$_{CB}$, EN_L$_{MON}$) into the second high-potential-side control signal (EN_H$_{TAP}$, EN_H$_{CB}$, EN_H$_{MON}$) of a potential lower than the first high-potential-side control signal. At least one of the second level shifter circuit, the third level shifter circuit, and the fourth level shifter circuit is provided with the following elements.

A first current mirror (51) which is supplied with a reference current (I$_{ref}$) and outputs a first current output at a predetermined magnification of the reference current.

A first high-withstand voltage transistor (35, 45) which controls the first current output on the basis of the first low-potential-side control signal and outputs a second current output.

A fifth resistor (26) which is coupled to a high-potential-side signal line and outputs the first high-potential-side control signal produced by a flow of the second current output.

A second high-withstand voltage transistor (34, 44) which controls the first current output on the basis of the second low-potential-side control signal and outputs a third current output.

A second current mirror (52, 53) which is supplied with the third current output and outputs a fourth current output at a predetermined magnification of the third current output.

A sixth resistor (25) which outputs the second high-potential-side control signal produced by a flow of the fourth current output.

According to the present structure, even in the case where the switch (11, 12, 13) comprised of the p-channel MOSFET (30_8) and the switch (11, 12, 13) comprised of the n-channel MOSFET (30_7) are intermingled, it is possible to configure the up-convert level shifter which is appropriate for driving each of the switches. Accordingly, it is possible to design the circuit area of the switch, etc. optimally.

(11) <An Overcharge Detection Comparator Circuit+an Overdischarge Detection Comparator Circuit+a Status Register>

In Paragraph 1, the comparator circuit is provided with a high-voltage-side comparator circuit (CCOMP12-CCOMP1) which compares the low-potential-side inter-terminal voltage with a high-voltage-side reference voltage (V$_{ref}$H), and a low-voltage-side comparator circuit (DCOMP12-DCOMP1) which compares the low-potential-side inter-terminal voltage with a low-voltage-side reference voltage (V$_{ref}$L). The semiconductor device is further provided with a register (10) which stores comparison results of each of the high-voltage-side comparator circuit and the low-voltage-side comparator circuit.

According to the present structure, it is possible to easily monitor externally the detection result of overcharge/overdischarge and the detection result of disconnection between a node of unit cells and a terminal.

(12) <A Status Register+a Control Register>

In Paragraph 2 or Paragraph 3, the comparator circuit is provided with a high-voltage-side comparator circuit (CCOMP12-CCOMP1) which compares the low-potential-side inter-terminal voltage with a high-voltage-side reference voltage (V$_{ref}$H), and a low-voltage-side comparator circuit (DCOMP12-DCOMP1) which compares the low-potential-side inter-terminal voltage with a low-voltage-side reference voltage (V$_{ref}$L).

The semiconductor device is provided with a status register (10) which stores comparison results of each of the high-voltage-side comparator circuit and the low-voltage-side comparator circuit. The semiconductor device is further provided with a control register (10) which stores at least one of the low-potential-side shunt control signal (EN_L$_{TAP}$), the low-potential-side sense enable signal (EN_L$_{MON}$), and the low-potential-side cell balance enable signal (EN_L$_{CB}$).

According to the present structure, it is possible to easily monitor externally the detection result of overcharge/overdischarge, the detection result of disconnection between anode of unit cells and a terminal, and the detection result of fault of the switch (15, 16) which discharges a unit cell in order to realize the cell balance function. Also, it is possible to easily control externally the semiconductor device so as to perform such detecting operation.

(13) <Generation of Interrupt Signal>

In Paragraph 11 or Paragraph 12, the semiconductor device is provided with an interrupt generating circuit (63) which generates an interrupt signal (INTO) on the basis of the comparison results of each of the high-voltage-side comparator circuit and the low-voltage-side comparator circuit.

According to the present structure, it is possible to detect occurrence of fault without monitoring the status register.

(14) <A Battery Voltage Monitoring Device=Plural Voltage Measurement Units+a Battery System Controller>

A battery voltage monitoring device is comprised of plural voltage measurement units provided for each group (BC$_{1\_1}$-BC$_{1\_N}$, . . . , BC$_{M\_1}$-BC$_{M\_N}$) of plural unit cells series-coupled in multi-stage and configuring an assembled battery, and a battery system controller (60) coupled to the plural voltage measurement units. Each of the plural voltage measurement units is comprised of a semiconductor device (1_1-1_M).

The semiconductor device is provided with the following elements.

A first terminal (C$_n$) to be coupled to a first node which is one electrode of a unit cell and is coupled to another unit cell in the plural unit cells, and a second terminal (C$_{n-1}$) to be coupled to a second node which is the other electrode of the unit cell and is coupled to another unit cell.

A voltage measurement circuit (7) which measures an inter-terminal voltage between the first terminal and the second terminal.

A first level shifter circuit (2) which converts the inter-terminal voltage into a low-potential-side inter-terminal voltage.

A comparator circuit (6) which compares the low-potential-side inter-terminal voltage with a predetermined reference voltage (V$_{ref}$).

A second level shifter circuit (3) which converts a low-potential-side shunt control signal (EN_L$_{TAP}$) into a high-potential-side shunt control signal (EN_H$_{TAP}$).

A first switch (11) which short-circuits the first terminal and the second terminal via a first resistor (21), on the basis of the high-potential-side shunt control signal.

According to the present structure, while satisfying the functional safety standards with dual-redundancy of the function of battery voltage monitoring and fault monitoring, it is possible to configure the battery voltage monitoring device in which each of plural voltage measurement units is provided with the semiconductor device which has realized the measurement of a battery voltage as well as the detection of overcharge/overdischarge and disconnection between a node of unit cells and a terminal as the function of fault monitoring, in a circuit formed on a single semiconductor substrate.

(15) <A Battery Voltage Monitoring Device Including Fault Detection of a Cell Balance Switch (a Separated Drain Type)>

In Paragraph 14, the semiconductor device is comprised of the following elements.

A third terminal ($B_n$) to be coupled to the first node.

A second resistor (22) coupled between the first terminal and the third terminal.

A third level shifter circuit (4) which converts a low-potential-side sense enable signal ($EN\_L_{MON}$) into a high-potential-side sense enable signal ($EN\_H_{MON}$).

A fourth level shifter circuit (5) which converts a low-potential-side cell balance enable signal ($EN\_L_{CB}$) into a high-potential-side cell balance enable signal ($EN\_H_{CB}$).

A third switch (12) which short-circuits the third terminal and the second terminal, on the basis of the high-potential-side cell balance enable signal.

At this time, the first level shifter circuit is provided with a voltage-to-current converter circuit (8) which converts the inter-terminal voltage into a current value corresponding to the inter-terminal voltage, and a current-to-voltage converter circuit (9) which converts the current value into a low-potential-side inter-terminal voltage corresponding to the current value. The first level shifter circuit is provided with a second switch (13) which controls operation of the voltage-to-current converter circuit on the basis of the high-potential-side sense enable signal, and a fourth switch (14) which controls operation of the voltage-to-current converter circuit on the basis of the potential of the third terminal, in parallel with the second switch.

According to the present structure, it is possible to configure the battery voltage monitoring device in which each of plural voltage measurement units is provided with the semiconductor device which has realized, in a circuit formed on a single semiconductor substrate, the fault detection of the switch (12) which discharges a unit cell in order to realize the cell balance function (function to correct the imbalance of the voltage among plural unit cells), while satisfying the functional safety standards with dual-redundancy with the monitoring of a battery voltage.

(16) <Fault Detection of a Cell Balance Switch (a Battery Voltage Monitoring Device Including a Separated Discharge Path Type and a Separated Drain/Source Type)>

In Paragraph 14, the semiconductor device is comprised of the following elements.

A third terminal ($B_n$, $BD_n$) to be coupled to the first node and a fourth terminal ($B_{n-1}$, $BS_n$) to be coupled to the second node.

A second resistor (22) coupled between the first terminal and the third terminal.

A third level shifter circuit (4) which converts a low-potential-side sense enable signal into a high-potential-side sense enable signal.

A fourth level shifter circuit (5) which converts a low-potential-side cell balance enable signal into a high-potential-side cell balance enable signal.

A fifth switch (15, 16) which short-circuits the third terminal and the fourth terminal on the basis of the high-potential-side cell balance enable signal.

At this time, the first level shifter circuit is provided with a voltage-to-current converter circuit (8) which converts the inter-terminal voltage into a current value corresponding to the inter-terminal voltage, and a current-to-voltage converter circuit (9) which converts the current value into a low-potential-side inter-terminal voltage corresponding to the current value. The first level shifter circuit is provided with a second switch (13) which controls operation of the voltage-to-current converter circuit, on the basis of the high-potential-side sense enable signal, and a fourth switch (14) which controls operation of the voltage-to-current converter circuit on the basis of the potential of the third terminal, in parallel with the second switch.

According to the present structure, it is possible to configure the battery voltage monitoring device in which each of plural voltage measurement units is provided with the semiconductor device which has realized, in a circuit formed on a single semiconductor substrate, the fault detection of the switch (15, 16) which discharges a unit cell in order to realize the cell balance function, while satisfying the functional safety standards with dual-redundancy with the monitoring of a battery voltage.

(17) (a Battery Voltage Monitoring Device Including an Overcharge Detection Comparator Circuit+an Overdischarge Detection Comparator Circuit+a Status Register>

In Paragraph 14, the comparator circuit is provided with a high-voltage-side comparator circuit (CCOMP12-CCOMP1) which compares the low-potential-side inter-terminal voltage with a high-voltage-side reference voltage ($V_{ref}H$), and a low-voltage-side comparator circuit (DCOMP12-DCOMP1) which compares the low-potential-side inter-terminal voltage with a low-voltage-side reference voltage ($V_{ref}L$). The semiconductor device is further provided with a status register (10) which stores comparison results of each of the high-voltage-side comparator circuit and the low-voltage-side comparator circuit.

The semiconductor device included in each of the plural voltage measurement units is coupled to the battery system controller via a communication path (61), and the battery system controller enables the status register accessible via the communication path.

According to the present structure, it is possible to easily monitor, from a battery system controller (60), the detection result of overcharge/overdischarge and the detection result of disconnection between a node of unit cells and a terminal, in the semiconductor device (1_1-1_M) of each voltage measurement unit.

(18) <A Battery Voltage Monitoring Device Including a Status Register+a Control Register>

In Paragraph 15 or Paragraph 16, the comparator circuit is provided with a high-voltage-side comparator circuit (CCOMP12-CCOMP1) which compares the low-potential-side inter-terminal voltage with a high-voltage-side reference voltage ($V_{ref}H$), and a low-voltage-side comparator circuit (DCOMP12-DCOMP1) which compares the low-potential-side inter-terminal voltage with a low-voltage-side reference voltage ($V_{ref}L$).

The semiconductor device is provided with a status register (10) which stores comparison results of each of the high-voltage-side comparator circuit and the low-voltage-side comparator circuit. The semiconductor device is further provided with a control register (10) which stores at least one of the low-potential-side shunt control signal ($EN\_L_{TAP}$), the low-potential-side sense enable signal ($EN\_L_{MON}$), and the low-potential-side cell balance enable signal ($EN\_L_{CB}$).

The semiconductor device included in each of the plural voltage measurement units is coupled to the battery system controller via a communication path (61), and the battery system controller enables the status register and the control register accessible via the communication path.

According to the present structure, it is possible to easily monitor, from the battery system controller (60), the detection result of overcharge/overdischarge, the detection result of disconnection between a node of unit cells and a terminal, and the detection result of fault of the switch (15, 16) which discharges a unit cell in order to realize the cell balance function, in the semiconductor device (1_1-1_M) of each voltage measurement unit. Furthermore, it is possible to easily control the semiconductor device so as to perform such detecting operation, from the battery system controller (60).

(19) <A Battery Voltage Monitoring Device Including an Interrupt Signal>

In Paragraph 17 or Paragraph 18, the semiconductor device is provided with an interrupt generating circuit which generates an interrupt signal (INTO) to the battery system controller, on the basis of the comparison results of each of the high-voltage-side comparator circuit and the low-voltage-side comparator circuit.

According to the present structure, the battery system controller (60) can detect occurrence of fault, without monitoring the status register.

2. Details of Embodiments

The embodiments are further explained in full detail.

Embodiment 1

<Tap Disengagement Detection+Overcharge/Overdischarge Detection+Cell Voltage Measurement>

FIG. 1 illustrates a configuration of principal parts of a battery voltage monitoring IC according to Embodiment 1.

A battery voltage monitoring IC (a semiconductor device) 1 is for measuring a cell voltage of each of plural unit cells $BC_1$-$BC_{12}$ which are series-coupled in multi-stage to configure an assembled battery. The battery voltage monitoring IC 1 is comprised of terminals $C_0$-$C_{12}$ coupled to each of nodes coupled in series across both poles of the unit cells $BC_1$-$BC_{12}$, and is configured as follows, for example. There exists wiring resistance $Rf_0$-$Rf_{12}$ between each of the nodes of unit cells $BC_1$-$BC_{12}$ and each of the terminals $C_0$-$C_{12}$, and there also exists parasitic capacitance $Cf_0$-$Cf_{12}$ between the adjoining pair of the terminals $C_0$-$C_{12}$.

All the signals inputted from the terminals $C_0$-$C_{12}$ are directly supplied to a voltage measurement circuit 7. The voltage measurement circuit 7 can be configured by combining a multiplexer MUX and an analog-to-digital converter ADC, for example. The multiplexer MUX is comprised of plural switches, selects a signal from the adjoining pair of terminals $C_n$ and $C_{n-1}$, and transmits it to the analog-to-digital converter ADC. The signal from the adjoining pair of terminals $C_n$ and $C_{n-1}$ is a cell voltage of a unit cell $BC_n$. The signal is measured by the analog-to-digital converter ADC and the converted digital value is outputted. By the multiplexer MUX, the unit cells $BC_1$-$BC_{12}$ are selected sequentially, and each cell voltage is measured. The analog-to-digital converter ADC may adopt a delta-sigma ADC, a successive-approximation ADC, and others.

The plural unit cells $BC_1$-$BC_{12}$ are series-coupled, accordingly, a unit cell located closer to the terminal $C_{12}$ has a higher potential, even though the cell voltage for each unit cell is low. For example, when 12 unit cells of a lithium-ion battery, which has a unit cell voltage of about 3.7V, are coupled in series as illustrated in the present embodiment, the potential of the terminal $C_{12}$ with reference to the terminal C0 is 44.4V normally but may amount to 50V when all unit cells are in an overcharge state. The signal of the terminals $C_n$ and $C_{n-1}$ illustrated in FIG. 1 is equal to the voltage of a unit cell (for example, 3.7V) as the inter-terminal voltage. However, the potential of the signal is as high as the potential corresponding to n−1 stages of unit cells, and is equal to 33.3V when n=10, for example.

The battery voltage monitoring IC 1 according to Embodiment 1 is provided with a down-convert level shifter circuit 2 which converts the inter-terminal voltage between the terminals $C_n$ and $C_{n-1}$ at a high potential side into a low-potential-side inter-terminal voltage, and a comparator circuit 6 which compares the converted low-potential-side inter-terminal voltage with a predetermined reference voltage ($V_{ref}$). The battery voltage monitoring IC 1 is also provided with an up-convert level shifter circuit 3 which converts a low-potential-side shunt control signal (EN_L$_{TAP}$) into a high-potential-side shunt control signal (EN_H$_{TAP}$), and a switch 11 which short-circuits the terminals $C_n$ and $C_{n-1}$ via a resistor $R_{TAP}$ 21, on the basis of the converted high-potential-side shunt control signal.

Operation of the battery voltage monitoring IC 1 according to Embodiment 1 is explained.

In the normal operation, the switch 11 is opened (set to OFF) and the voltage for each unit cell is measured by the voltage measurement circuit 7. In addition, the comparator circuit 6 performs overcharge/overdischarge detection by comparing the low-potential-side inter-terminal voltage converted by the down-convert level shifter circuit 2, with a predetermined reference voltage ($V_{ref}$). Since others circuits except for the terminals $C_0$-$C_{12}$ are separated and independent, the measurement of a battery voltage and the overcharge/overdischarge detection as one of the fault monitoring function are provided with dual redundancy.

The comparator circuit 6 may be comprised of a high-voltage-side comparator circuit which compares the low-potential-side inter-terminal voltage converted by the down-convert level shifter circuit 2 with a high-voltage-side reference voltage ($V_{ref}H$), and a low-voltage-side comparator circuit which compares the low-potential-side inter-terminal voltage with the low-voltage-side reference voltage ($V_{ref}L$). In the case of a lithium-ion battery for example, it is possible for the high-voltage-side comparator circuit to detect the overcharge state, by setting the high-voltage-side reference voltage ($V_{ref}H$) to 4.5V, and it is possible for the low-voltage-side comparator circuit to detect the overdischarge state, by setting the low-voltage-side reference voltage ($V_{ref}L$) to 2V.

In order to explain operation of the detection of disconnection between a node of unit cells and a terminal, it is assumed that the wiring which couples the node of the unit cells $BC_{n+1}$ and $BC_n$ and the terminal $C_n$ is disconnected. Wiring is provided from the node of the unit cells $BC_{n+1}$ and $BC_n$ to the terminal $C_n$ for measurement. This wiring may be disconnected, and the phenomenon is called tap disengagement or tap disconnection. Even if tap disengagement occurs at the terminal $C_n$, it is difficult to detect the tap disengagement, since parasitic capacitance $Cf_n$ holds the cell voltage of the unit cell $BC_n$. This is because the charge stored in the parasitic capacitance $Cf_n$ cannot be drawn out, since the monitoring of a battery voltage is configured at high impedance so that a battery may not be consumed as much as possible. The potential of the terminal $C_n$ tends to be maintained at the midpoint of the terminal $C_{n+1}$ and the terminal $C_{n-1}$ by capacitive subdivision of the parasitic capacitance $Cf_{n+1}$ and $Cf_n$. Accordingly, in order to detect the tap disengagement of the terminal $C_n$, the terminal C, and the terminal $C_{n-1}$ are short-circuited with the switch 11 via $R_{TAP}$ 21. Accordingly, the charge stored in the parasitic capacitance $Cf_n$ can be drawn out, and when there exists disconnection, the voltage between the terminal $C_n$ and the terminal $C_{n-1}$ becomes low. This voltage is converted into a low-potential-side inter-terminal voltage by the down-convert level shifter circuit 2, and is compared with a predetermined reference voltage $V_{ref}$ by the comparator circuit 6. By this means, the tap disengagement detection, i.e., the detection of disconnection between a node of unit cells and a terminal is performed. The down-convert level shifter circuit 2 and the comparator circuit 6 cannot perform concurrently the detection of overcharge/overdischarge and the detection of disconnection between a node of unit cells and a terminal, when they are configured to be shared by the detection of overcharge/overdischarge. However, both kinds of detection are the function of fault monitoring; therefore, when each of them is provided with dual redundancy with the monitoring of a battery voltage, it is possible to satisfy the functional safety standards.

In the present embodiment, even when fault occurs in the voltage measurement circuit 7, the detection of overcharge/overdischarge or the detection of disconnection between a node of unit cells and a terminal by use of the down-convert level shifter circuit 2 and the comparator circuit 6 are performed normally. On the other hand, even when fault occurs in the down-convert level shifter circuit 2 and the comparator circuit 6, disenabling the normal operation of the overcharge/overdischarge detection system, the monitoring of a battery voltage can be performed normally.

In FIG. 1, the attention is paid to the unit cell $BC_n$, and circuits for measuring the cell voltage of other unit cells are omitted. In order to measure the cell voltage of each of the plural unit cells $BC_1$-$BC_{12}$, the same circuits are provided in all the terminals. By this means, it is possible to realize the function of the fault monitoring for all the unit cells $BC_1$-$BC_{12}$. The terminals $C_0$-$C_{12}$ have mutually different potentials, however, the inter-terminal voltages with different potentials are converted into low-potential-side inter-terminal voltages with the same reference potential by the down-convert level shifter circuit 2. On the other hand, it is necessary that the signal $EN\_H_{TAP}$ for controlling the switch 11 is assigned with a different potential for every unit cell. Therefore, the up-convert level shifter circuit 3 performs the up-convert level shift which assigns a suitable potential to the high-potential-side shunt control signal $EN\_H_{TAP}$.

The inter-terminal voltage is level-shifted to the low potential side; therefore, it is possible to configure the comparator circuit 6 with devices which treat a signal of low potential and small amplitude. It is possible to limit the circuits which have various potential levels to the minimum circuits including the switch 11. Therefore, it is possible to minimize the number of devices which require the high-cost device structure such as a multi-well. When plural comparator circuits 6 are provided corresponding to plural unit cells, it is possible to share the voltage supply which generates the reference voltage. Therefore, it is possible to suppress the increase in a chip area.

According to the present structure, while satisfying the functional safety standards with dual-redundancy of the function of battery voltage monitoring and fault monitoring, it is possible to realize the measurement of a battery voltage as well as the detection of overcharge/overdischarge and disconnection between a node of unit cells and a terminal as the function of fault monitoring, in a circuit formed on a single semiconductor substrate.

Embodiment 2

<Fault Detection of a Cell Balance Switch (a Separated Drain Type)>

Figure 2:
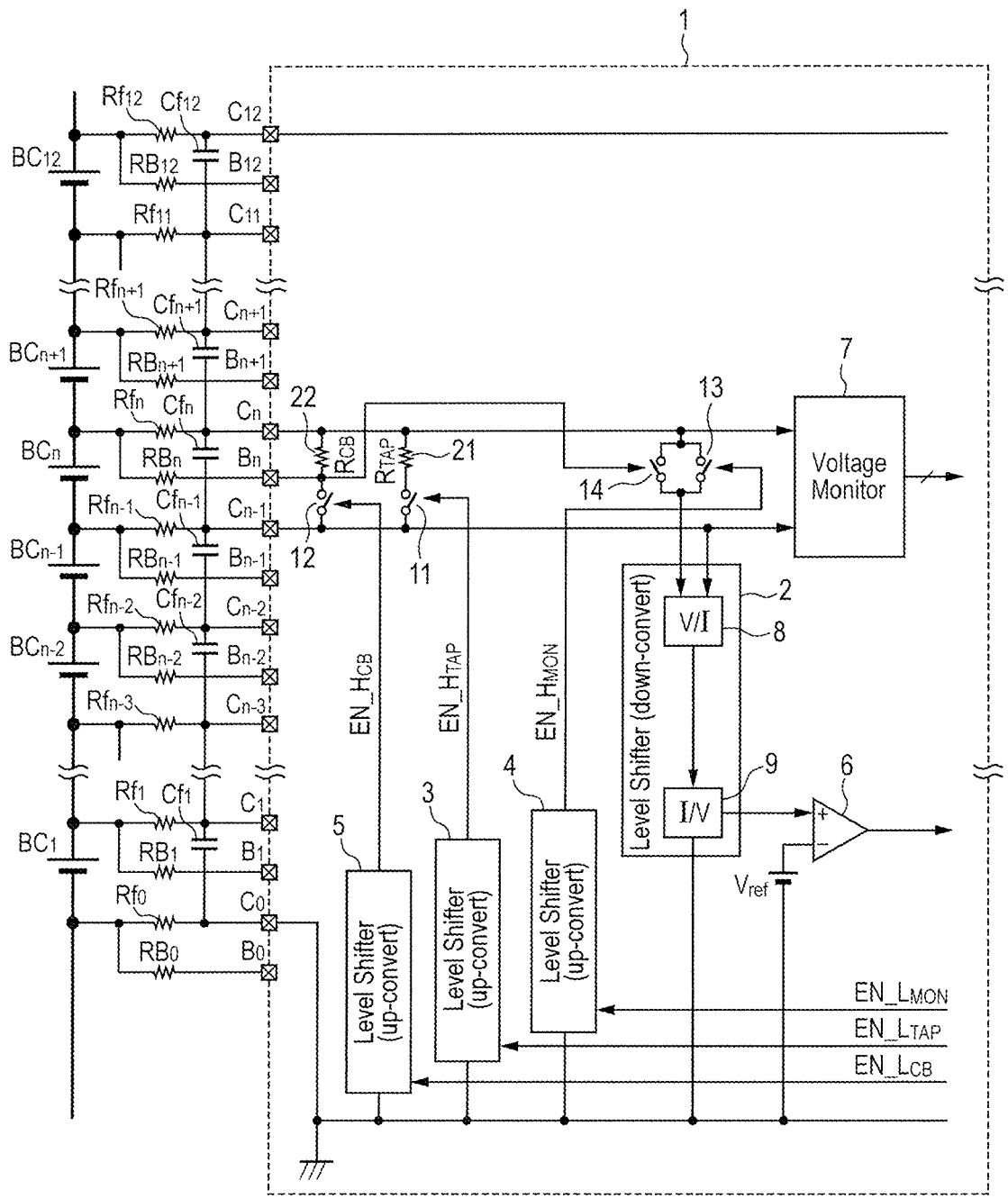
FIG. 2 is a drawing illustrating a configuration of principal parts of a battery voltage monitoring IC according to Embodiment 2.

FIG. 2 illustrates a configuration of principal parts of a battery voltage monitoring IC according to Embodiment 2. The battery voltage monitoring IC according to Embodiment 2 adds the cell balance function and the fault detection function of a switch for attaining a cell balance to the battery voltage monitoring IC according to Embodiment 1. Here, the cell balance function means the function for maintaining the cell voltage of the plural series-coupled unit cells at an approximately equal value. A unit cell exhibiting a higher cell voltage compared with other unit cells is discharged by short-circuiting the terminals thereof, so that the unit cell is controlled to exhibit a substantially equal cell voltage as the other unit cells. What is necessary is to be balanced approximately and controlling to a strictly equal voltage is not necessary. Depending on a path which transmits current when the terminals of a unit cell is short-circuited, three kinds of modifications are possible.

Figure 3A:
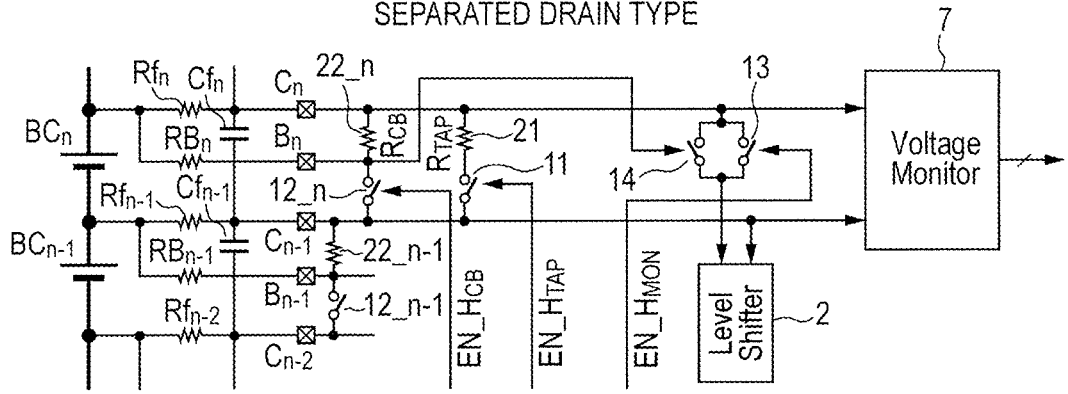
FIGS. 3A, 3B, and 3C are explanatory diagrams illustrating modified examples of the battery voltage monitoring IC provided with cell balance function.
Figure 3B:
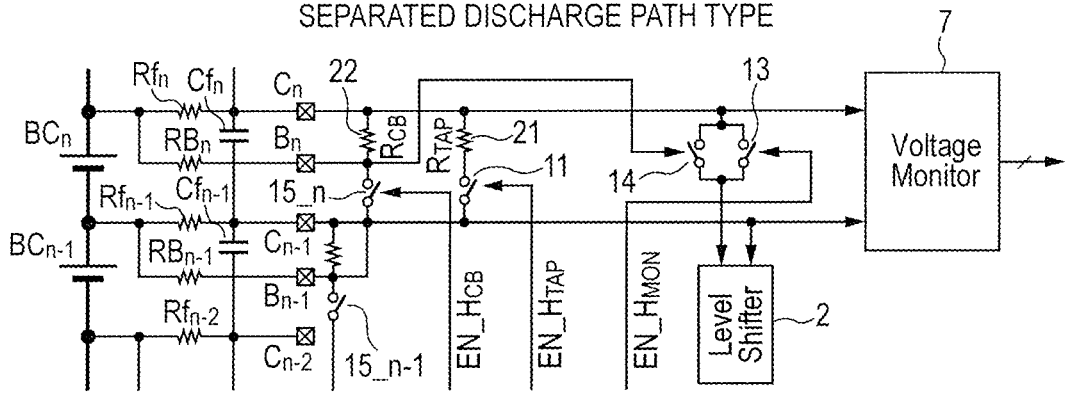
Figure 3C:
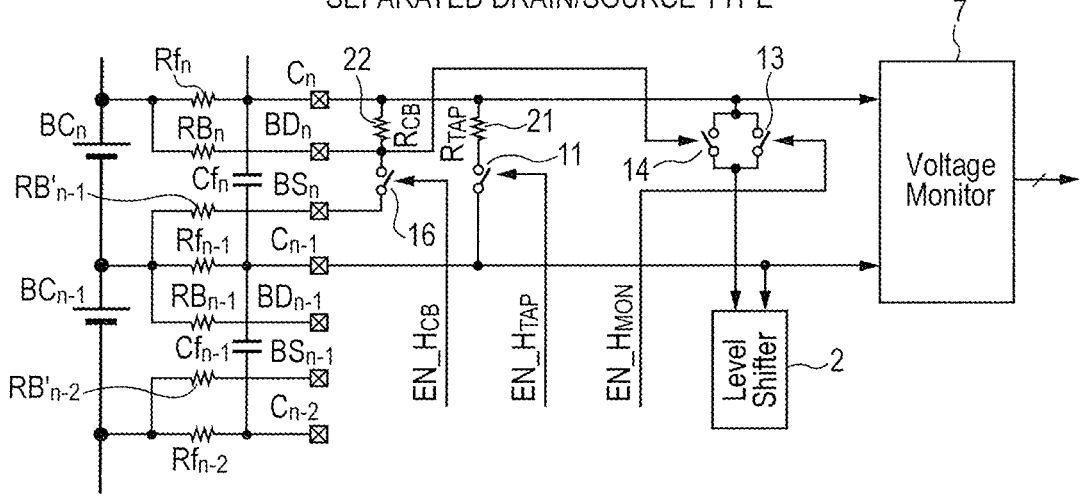

FIGS. 3A, 3B, and 3C are explanatory diagrams illustrating modified examples of the battery voltage monitoring IC provided with cell balance function; FIG. 3A illustrates a separated drain type, FIG. 3B illustrates a separated discharge path type, and FIG. 3C illustrates a separated drain/source type. Each feature will be described later. The battery voltage monitoring IC illustrated in FIG. 2 is the example which adopts the separated drain type illustrated in FIG. 3A.

In addition to the terminals $C_0$-$C_{12}$, terminals $B_0$-$B_{12}$ for the cell balance, coupled at the same node, are provided. The terminals $B_0$-$B_{12}$ are coupled via resistors $RB_0$-$RB_{12}$ to the nodes coupled in series across both poles of the unit cells $BC_1$-$BC_{12}$. FIG. 2 illustrates only the unit cell $BC_n$, for simplicity. In order to discharge the unit cell $BC_n$, a switch 12 is provided for short-circuiting the terminal $B_n$ and the terminal $C_{n-1}$. In order to generate a high-potential-side cell balance enable signal $EN\_H_{CB}$ which controls ON and OFF of the switch 12, an up-convert level shifter 5 is provided. The up-convert level shifter 5 performs the level conversion of a low-potential-side cell balance enable signal $EN\_L_{CB}$, and generates the high-potential-side cell balance enable signal $EN\_H_{CB}$.

What are described above are the circuits necessary for the normal operation of the cell balance function.

The following explains circuits for detecting fault of the switch 12 which realizes the cell balance function. Switches 13 and 14 are provided in parallel between a down-convert level shifter 2 and the terminal $C_n$. The switch 13 is on/off controlled by a high-potential-side sense enable signal $EN\_H_{MON}$. In order to generate the high-potential-side monitor enable signal $EN\_H_{MON}$ from a low-potential-side monitor enable signal $EN\_L_{MON}$, an up-convert level shifter 4 is provided. The signal from the terminal $B_n$ is supplied to the switch 14. The switch 12 is provided between the signal from the terminal $B_n$ and the terminal $C_{n-1}$, and the signal from the terminal $B_n$ is pulled-up to the terminal $C_n$ via a resistor $R_{CB}$.

The normal operation of cell balance function is explained.

When the cell voltage of the unit cell $BC_n$ becomes higher than those of other unit cells, the switch 12 is closed to discharge the unit cell $BC_n$. The path through which the discharge current flows starts from the positive electrode of the unit cell $BC_n$, passes through a resistor $RB_n$, the terminal $B_n$, the switch 12, the terminal $C_{n-1}$, and a resistor $Rf_{n-1}$, and returns to the negative electrode of the unit cell $BC_n$.

The operation in detecting fault of the switch 12 is explained.

The switch 13 is set to OFF by the high-potential-side sense enable signal $EN\_H_{MON}$. When the switch 12 is closed and the switch 12 works normally, the potential difference between the terminal $B_n$ and the terminal $C_{n-1}$ becomes nearly 0V. It is because the on-resistance of the switch 12 is designed to be lower enough than the resistor $RB_n$, accordingly, the voltage drop is produced mostly in the resistor $RB_n$. If the switch 12 is designed to have somewhat higher on-resistance and to consume electric power, there exists a possibility that the battery voltage monitoring IC 1 may be overheated. When the potential difference between the terminal $B_n$ and the terminal $C_{n-1}$ becomes nearly 0V, the switch 14 is not set to ON. Since the switch 13 is also set to OFF, the down-convert level shifter 2 does not operate, and the output thereof is set to 0V.

On the other hand, when the switch 12 is unable to be set to ON due to fault (disconnection fault), the potential of the terminal $B_n$ rises to the same potential as the terminal $C_n$ by the pull-up resistor 22. Accordingly, the switch 14 is set to ON, and the down-convert level shifter 2 operates to output the low-potential-side inter-terminal voltage corresponding to the cell voltage of the unit cell $BC_n$.

When the switch 12 is always set to ON due to fault (sticking conduction fault), the switch 14 is set always to ON, even if the switch 12 is not controlled to be ON by the cell balance enable signal $EN\_L_{CB}$, since the switch 12 is set to ON due to fault.

When the switch 13 is set to OFF by the sense enable signal $EN\_L_{MON}$ and the switch 12 is controlled to be set to ON by the cell balance enable signal $EN\_L_{CB}$, if the output of the down-convert level shifter 2 becomes 0V, it is determined that the switch 12 is normal, however, if the low-potential-side inter-terminal voltage corresponding to the cell voltage of the unit cell $BC_n$ is outputted, it is determined that the switch 12 is in the disconnection fault. When the switch 13 is set to OFF by the sense enable signal $EN\_L_{MON}$ and the switch 12 is controlled to be set to OFF by the cell balance enable signal $EN\_L_{CB}$, if the output of the down-convert level shifter 2 becomes 0V, it is determined that the switch 12 is in the sticking conduction fault, however, if the low-potential-side inter-terminal voltage corresponding to the cell voltage of the unit cell $BC_n$ is outputted, it is determined that the switch 12 is normal. The switch 13 and the switch 14 may be formed by an n-channel FET or a p-channel FET. The signal level for the on-off control described above may be adjusted suitably, according to the type of FET adopted in the switch.

According to the present structure, it is possible to realize, with a circuit formed on a single semiconductor substrate, the fault detection of the switch (12) which discharges a unit cell in order to realize the cell balance function, while satisfying the functional safety standards with dual-redundancy with the monitoring of a battery voltage.

Embodiment 3

<Fault Detection of a Cell Balance Switch (a Separated Discharge Path Type and a Separated Drain/Source Type)>

FIGS. 3A, 3B, and 3C are explanatory diagrams illustrating modified examples of the battery voltage monitoring IC provided with cell balance function; FIG. 3A illustrates a separated drain type, FIG. 3B illustrates a separated discharge path type, and FIG. 3C illustrates a separated drain/source type. In Embodiment 2, the separated drain type illustrated in FIG. 3A is adopted. However, even when other methods are adopted, it is possible to perform similarly the fault detection of the switch 12 which discharges a unit cell in order to realize the cell balance function.

In the separated drain type illustrated in FIG. 3A, in addition to the terminals $C_0$-$C_{12}$, terminals $B_0$-$B_{12}$ for the cell balance, coupled at the same node, are provided. The terminals $B_0$-$B_{12}$ are coupled via resistors $RB_0$-$RB_{12}$ to the nodes coupled in series across both poles of the unit cells $BC_1$-$BC_{12}$. In order to discharge the unit cell $BC_n$, a switch 12 is provided for short-circuiting the terminal $B_n$ and the terminal $C_{n-1}$. The path for discharging the unit cell $BC_n$ is from the resistor $RB_n$, via the terminal $B_n$, the switch 12_n, and the terminal $C_{n-1}$, and to the resistor $Rf_{n-1}$. The path for discharging an adjoining unit cell $BC_{n-1}$ is from a resistor $RB_{n-1}$, via a terminal $B_{n-1}$, a switch 12_n-1, and a terminal $C_{n-2}$, and to a resistor $Rf_{n-2}$. There is no overlap in the discharge paths of the adjoining unit cells; therefore, it is possible to discharge 12 unit cells concurrently. Although it is not realistic to discharge all the unit cells concurrently by the cell balance function, the fact that to discharge two adjoining unit cells concurrently is allowed is an advantage. However, it is not possible to measure the cell voltage of a unit cell during the discharge. This is because the wiring resistance Rfn−1 is included in the discharge path and the voltage drop (IR drop) due to the discharge current occurs in the wiring resistance $Rf_{n-1}$ during the discharge; accordingly, it is difficult to measure the cell voltage correctly.

In the separated discharge path type illustrated in FIG. 3B, as is the case with the separated drain type illustrated in FIG. 3A, in addition to the terminals $C_0$-$C_{12}$, terminals $B_0$-$B_{12}$ for the cell balance, coupled at the same node, are provided. The terminals $B_0$-$B_{12}$ are coupled via resistors $RB_0$-$RB_{12}$ to the nodes coupled in series across both poles of the unit cells $BC_1$-$BC_{12}$. On the other hand, unlike with the separated drain type illustrated in FIG. 3A, a switch 15 for discharging the unit cell $BC_n$ is provided so as to short-circuit the terminal $B_n$ and the terminal $B_{n-1}$. The path for discharging the unit cell $BC_n$ is from the resistor $RB_n$, via the terminal $B_n$, the switch 15_n, and the terminal $B_{n-1}$, and to the resistor $RB_{n-1}$. In the separated discharge path type, it is not possible to discharge the adjoining unit cells concurrently. This is because, if a switch 15_n-1 for discharging the adjoining unit cell is set to ON concurrently with the switch 15_n, the discharge current flows not through the discharge path described above but towards the switch 15_n-1. On the other hand, the wiring resistance $Rf_n$ and $Rf_{n-1}$ are not included in the discharge path, therefore, it is possible to measure the cell voltage of the unit cell $BC_n$ by the voltage measurement unit 7 during the discharging period for the cell balance.

In the separated drain/source type illustrated in FIG. 3C, two sets of terminals $BD_0$-$BD_{12}$ and $BS_0$-$BS_{12}$, coupled to the same node respectively, are provided for the cell balance. A switch 16 for discharging the unit cell $BC_n$ is provided so as to short-circuit the terminal $BD_n$ and the terminal $BS_n$. The path for discharging the unit cell $BC_n$ is from the resistor $RB_n$, via the terminal $BD_n$, the switch 16_n, and the terminal BS, and to a resistor $RB'_n$. There is no overlap in the discharge paths of the adjoining unit cells; therefore, it is possible to discharge the adjoining unit cells concurrently. The wiring resistance $Rf_n$ and $Rf_{n-1}$ are not included in the discharge path; therefore, it is possible to measure the cell voltage of the unit cell $BC_n$ by the voltage measurement unit 7 during the discharging period for the cell balance as well. When compared with the types illustrated in FIGS. 3A and 3B, the type illustrated in FIG. 3C requires more numbers of terminals, but exhibits the improved performance.

When either of the types illustrated in FIGS. 3B and 3C is adopted, as is the case with Embodiment 2 illustrated in FIG. 2, it is possible to perform the fault detection of the short-circuiting switches 15 and 16 for the cell balance, by pulling up the high potential side of the switches 15 and 16 by the resistor $R_{CB}$ (22), and by coupling to the switch 14 for the on-off control of the operation of the down-convert level shifter 2. The detecting operation is the same as the operation explained in Embodiment 2.

Embodiment 4

<A Down-Convert Level Shifter Circuit by Use of a High Withstand Voltage FET>

Figure 4:
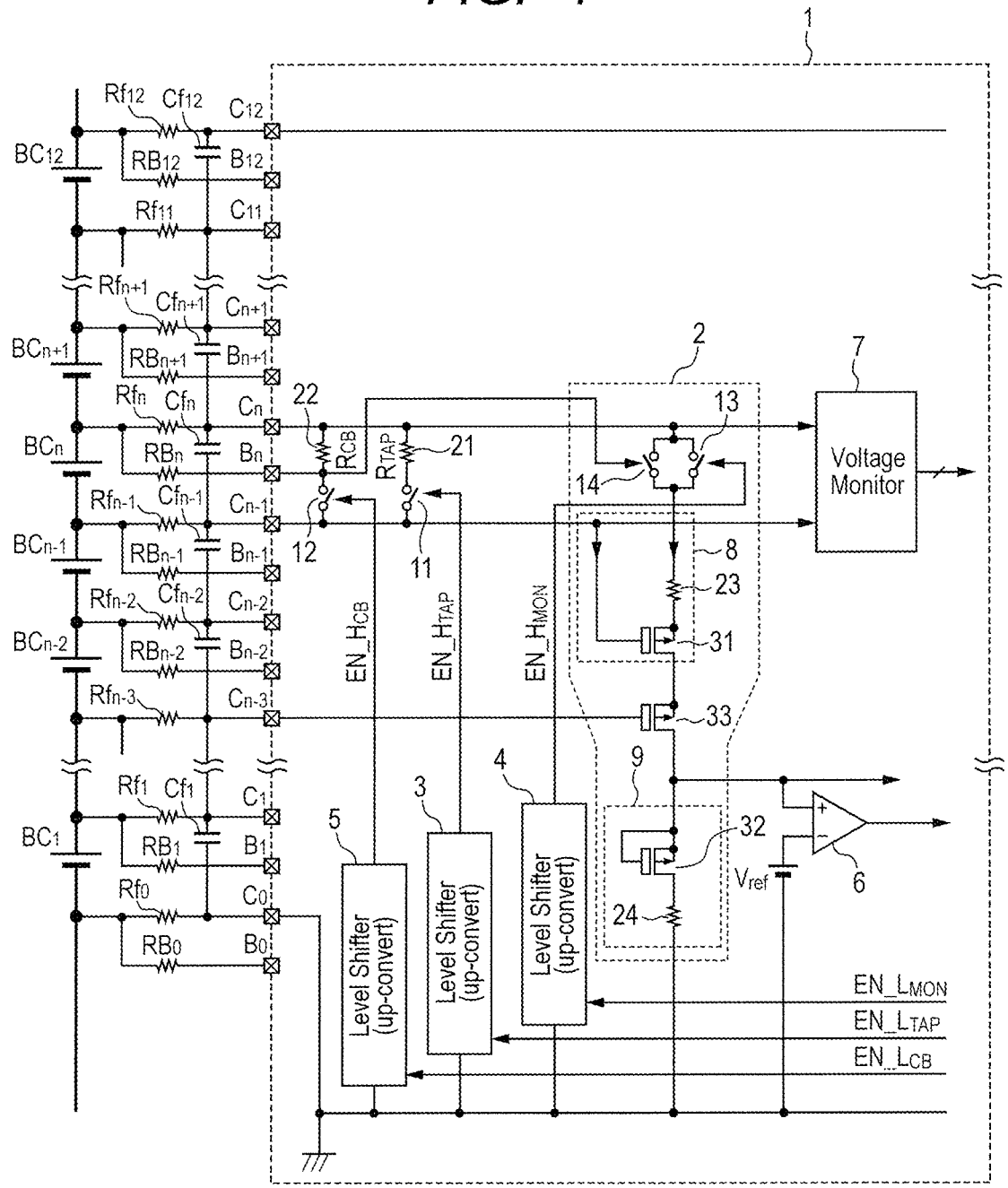
FIG. 4 is an explanatory diagram illustrating an example in which a down-convert level shifter circuit of the battery voltage monitoring IC is comprised of a high withstand voltage MOSFET.

FIG. 4 is an explanatory diagram illustrating an example in which a down-convert level shifter circuit 2 of the battery voltage monitoring IC is comprised of a high withstand voltage MOSFET. MOSFETs 31, 32, and 33 of which the gate electrodes are depicted with a thick outline bar are high withstand voltage MOSFETs. It is possible to realize the high withstand voltage by the well-known methods, such as by thickening a gate oxide layer or providing a drain with an offset region.

The down-convert level shifter circuit 2 is comprised of a voltage-to-current converter circuit 8 and a current-to-voltage converter circuit 9. The voltage-to-current converter circuit 8 is comprised of the high withstand voltage MOSFET 31 and a resistor 23, and converts the voltage between the terminals $C_n$ and $C_{n-1}$ as the cell voltage of the unit cell $BC_n$ into a conversion current of the corresponding current value. In further detail, assuming that an inter-terminal voltage is $V_{BH}$, a threshold voltage of the high withstand voltage MOSFET 31 is $Vt_{31}$, and a value of resistance of the resistor 23 is $Rs_{23}$, it is obtained that the conversion current $Ic=(V_{BH}-Vt_{31})/Rs_{23}$. The current-to-voltage converter circuit 9 is comprised of the high withstand voltage MOSFET 32 and a resistor 24, and outputs a low-potential-side inter-terminal voltage corresponding to the converted conversion current. In further detail, assuming that a threshold voltage of the high withstand voltage MOSFET 32 is $Vt_{32}$ and a value of resistance of the resistor is $Rs_{24}$, it is obtained that the low-potential-side inter-terminal voltage $VBL=Vt_{32}+IcRs_{24}$. A gate and a source of the high withstand voltage MOSFET 32 are short-circuited to form a diode; therefore, a forward voltage drop which corresponds to the threshold voltage $Vt_{32}$ is generated. The current-to-voltage converter circuit 9 operates on the basis of the ground potential; therefore, the high-potential-side inter-terminal voltage is shifted to the low-potential-side inter-terminal voltage. By setting equal respectively the threshold voltages of the high withstand voltage MOSFETs 31 and 32 and the values of resistance of the resistors 23 and 24, it is possible to shift only the potential of the voltage which is equal to the cell voltage of the unit cell.

In this way, it is possible to configure the down-convert level shifter with a high withstand voltage FET.

As described above, in order to perform the level shift between the terminal $C_n$ and the terminals $C_0$ as the ground potential with the two MOSFETs 31 and 32, it is necessary that the sum of the withstand voltages of two MOSFETs 31 and 32 exceeds sufficiently the potential difference between the terminal $C_n$ and the terminal $C_0$ as the ground potential. When a low withstand voltage MOSFET is employed, a MOSFET which is always set to "ON" is inserted in between, as exemplified by the MOSFET 33 illustrated in FIG. 4. By choosing the gate potential of the MOSFET 33 appropriately, the potential difference between the terminal $C_n$ and the terminal $C_0$ as the ground potential is applied to three MOSFETs, nearly equally distributed. Accordingly, it is possible to configure the down-convert level shifter 2 by use of MOSFETs each having a comparatively low withstand voltage. It is preferable to choose the gate potential appropriately from a node in the middle of the series-coupled unit cells. It is also preferable to insert two or more MOSFETs in between.

Accordingly, it is possible to configure the down-convert level shifter by use of a high withstand voltage FET of a withstand voltage lower than the voltage of the assembled battery.

Embodiment 5

<A Down-Convert Level Shifter Circuit by Use of a High Withstand Voltage Bipolar Transistor>

Figure 5:
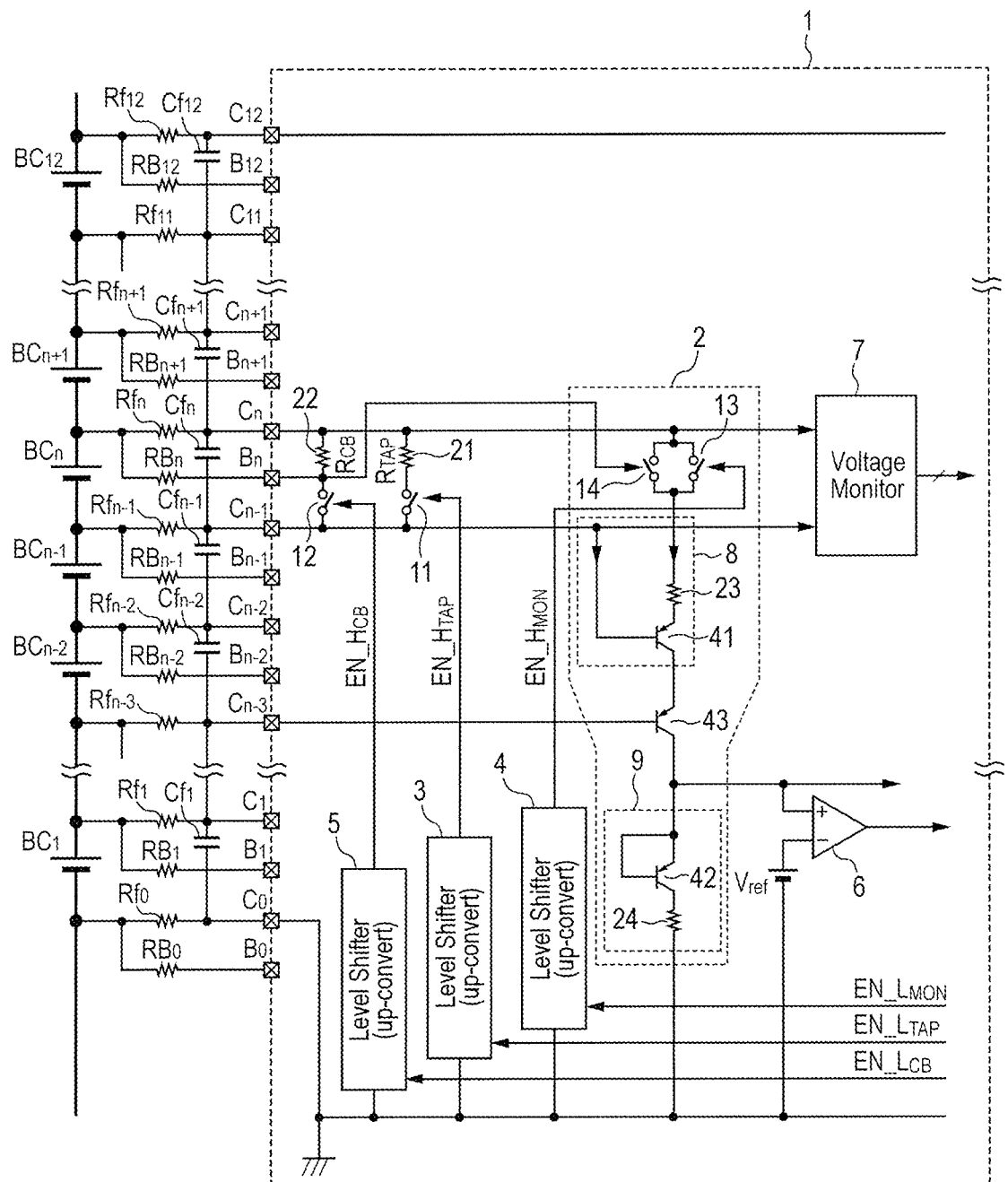
FIG. 5 is an explanatory diagram illustrating an example in which the down-convert level shifter circuit of the battery voltage monitoring IC is comprised of a high withstand voltage bipolar transistor.

FIG. 5 is an explanatory diagram illustrating an example in which the down-convert level shifter circuit 2 of the battery voltage monitoring IC is comprised of a high withstand voltage bipolar transistor. The down-convert level shifter circuit 2 is comprised of bipolar transistors 41, 42, and 43, in lieu of the high withstand voltage MOSFETs 31, 32, and 33 illustrated in FIG. 4. When the withstand voltage of the bipolar transistors 41 and 42 is high enough, the bipolar transistor 43 is not necessary. When the withstand voltage of the bipolar transistors 41 and 42 is low, on the contrary, it is preferable to insert plural bipolar transistors of the same kind as the bipolar transistors 43, in between.

As is the case with Embodiment 4, the down-convert level shifter circuit 2 is comprised of a voltage-to-current converter circuit 8 and a current-to-voltage converter circuit 9. The voltage-to-current converter circuit 8 is comprised of the bipolar transistor 41 and a resistor 23, and converts the voltage between the terminals $C_n$ and $C_{n-1}$ as the cell voltage of the unit cell $BC_n$ into a conversion current of the corresponding current value. The current-to-voltage converter circuit 9 is comprised of the bipolar transistor 42 and a resistor 24, and outputs a low-potential-side inter-terminal voltage corresponding to the converted conversion current. The current-to-voltage converter circuit 9 operates on the basis of the ground potential; therefore, the high-potential-side inter-terminal voltage is shifted to the low-potential-side inter-terminal voltage.

In this way, it is possible to configure the down-convert level shifter with a bipolar transistor.

Embodiment 6

<An Up-Convert Level Shifter Circuit by Use of a High Withstand Voltage FET>

Figure 6:
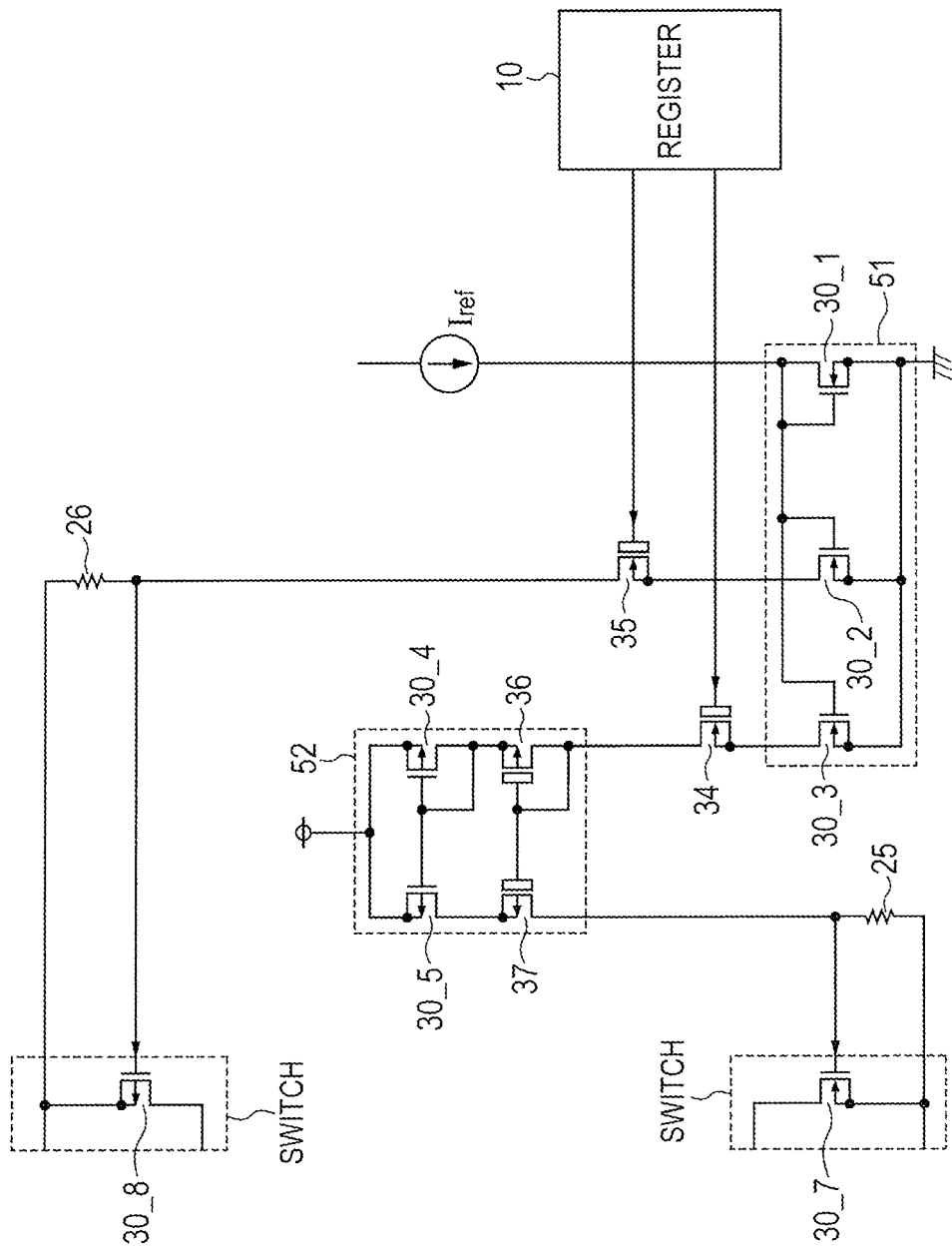
FIG. 6 is an explanatory diagram illustrating an example in which an up-convert level shifter circuit of the battery voltage monitoring IC is comprised of a high withstand voltage MOSFET.

FIG. 6 is an explanatory diagram illustrating an example in which an up-convert level shifter circuit of the battery voltage monitoring IC is comprised of a high withstand voltage MOSFET.

The up-convert level shifter circuits 3, 4, and 5 convert a low-potential-side control signal ($EN\_L_{TAP}$, $EN\_L_{CB}$, $EN\_L_{MON}$) into a high-potential-side control signal ($EN\_H_{TAP}$, $EN\_H_{CB}$, $EN\_H_{MON}$). Each of the low-potential-side control signal and the high-potential-side control signal can employ the bus arrangement formed by 12 signal lines respectively corresponding to 12 unit cells. However, FIG. 6 illustrates an example in which two low-potential-side control signals are shifted to two high-potential-side control signals. Although not limited in particular, the low-potential-side control signals are stored in a register 10. The upper part of FIG. 6 illustrates a circuit which outputs the high-potential-side control signal for driving a switch comprised of a p-channel MOSFET 30_8. The lower part of FIG. 6 illustrates a circuit which outputs the high-potential-side control signal for driving a switch comprised of an n-channel MOSFET 30_7.

MOSFETs 34, 35, 36, and 37 of which the gate electrodes are depicted with a thick outline bar are high withstand voltage MOSFETs, and other MOSFETs are ordinary low withstand voltage MOSFETs. A current mirror 51 comprised of low withstand voltage MOSFETs 30_1, 30_2, and 30_3 is provided. The current mirror 51 is supplied with a reference current $I_{ref}$ and outputs a current at a predetermined magnification of the reference current to the high withstand voltage MOSFET 35 via the low withstand voltage MOSFET 30_2, and to the high withstand voltage MOSFET 34 via the MOSFET 30_3, respectively.

A gate of the high withstand voltage MOSFET 35 is supplied with one of the low-potential-side control signals, and a drain thereof is coupled to a resistor 26 and a gate of the p-channel MOSFET 30_8 which configures a switch. This signal line corresponds to the high-potential-side control signal. The other side of the resistor 26 is coupled to a source of the p-channel MOSFET 30_8 which configures the switch. This signal line corresponds to one of the terminals $C_0$-$C_{12}$ illustrated in FIG. 2.

The high withstand voltage MOSFET 35 performs the on-off control of the output current of the current mirror 51 according to the value of the low-potential-side control signal. When controlled to ON, the high withstand voltage MOSFET 35 makes the output current of the current mirror 51 flow through the resistor 26. Accordingly, a voltage drop is generated across the resistor 26, and a high-potential-side control signal is generated, which is based on the potential of one of the terminals $C_0$-$C_{12}$ as a reference potential. Since the high-potential-side control signal is lower than the terminal voltage, it is suitable for control of the switch comprised of the p-channel MOSFET 30_8.

A gate of the high withstand voltage MOSFET 34 is supplied with the other of the low-potential-side control signals, and a drain thereof is coupled to a current mirror 52. The output of the current mirror 52 is coupled to a resistor 25 and a gate of the n-channel MOSFET 30_7 which configures a switch. This signal line corresponds to the high-potential-side control signal. The other side of the resistor 25 is coupled to a source of the n-channel MOSFET 30_7 which configures the switch. This signal line corresponds to one of the terminals $C_0$-$C_{12}$ illustrated in FIG. 2.

The high withstand voltage MOSFET 34 performs the on-off control of the output current of the current mirror 51 according to the value of the low-potential-side control signal. When controlled to ON, the current further mirrored by the current mirror 52 flows through the resistor 25. Accordingly, a voltage drop is generated across the resistor 25, and a high-potential-side control signal is generated, which is based on the potential of one of the terminals $C_0$-$C_{12}$ as a reference potential. Since the high-potential-side control signal is higher than the terminal voltage, it is suitable for control of the switch comprised of the n-channel MOSFET 30_7.

From a structural viewpoint of the circuit, the switch comprised of the p-channel MOSFET 30_8 fits the highest potential side of the terminals $C_0$-$C_{12}$, and the switch comprised of the n-channel MOSFET 30_7 fits the lowest potential side. A switch arranged in between can be designed optimally, taking into consideration the size of the switch and the necessity of the current mirror 52. In order to obtain the same current driving capacity, the switch comprised of the n-channel MOSFET 30_7 requires a smaller area than the switch comprised of the p-channel MOSFET 30_8. On the other hand, in order to drive the switch comprised of the n-channel MOSFET 30_7, the current mirror 52 is necessary. For example, the switch 12 for the cell balance function needs the enlarged area of the switch itself in order to make large current flow. Therefore, even if the number of the current mirrors 52 increases, configuring comparatively many switches of the n-channel MOSFET 30_7 can reduce the entire chip area. On the other hand, the switches 11 and 13 do not make large current flow; therefore, the area of the switch itself can be made small. Therefore, configuring comparatively many switches of the p-channel MOSFET 30_8 and suppressing the number of the current mirrors 52 to be employed can reduce the entire chip area.

When the switch comprised of the n-channel MOSFET 30_7 is adopted sequentially from the comparatively low potential side, it is preferable to determine suitably the power supply voltage of the current mirror 52, the necessity of the high withstand voltage MOSFETs 36 and 37, or the number of stages, in accordance with the potential of the high-potential-side control signal to drive. When the switch comprised of the n-channel MOSFET 30_7 is arranged at the lowest potential side, it is also preferable to couple directly the low-potential-side control signal to drive, without employing a level shifter circuit.

When the withstand voltage of a MOSFET is comparatively low, a high withstand voltage MOSFET of the same kind as the MOSFET 33 illustrated in FIG. 4 is inserted in the middle of the input-output current path of a current mirror; accordingly, the withstand voltage can be distributed.

Embodiment 7

<An Up-Convert Level Shifter Circuit by Use of a High Withstand Voltage Bipolar Transistor>

Figure 7:
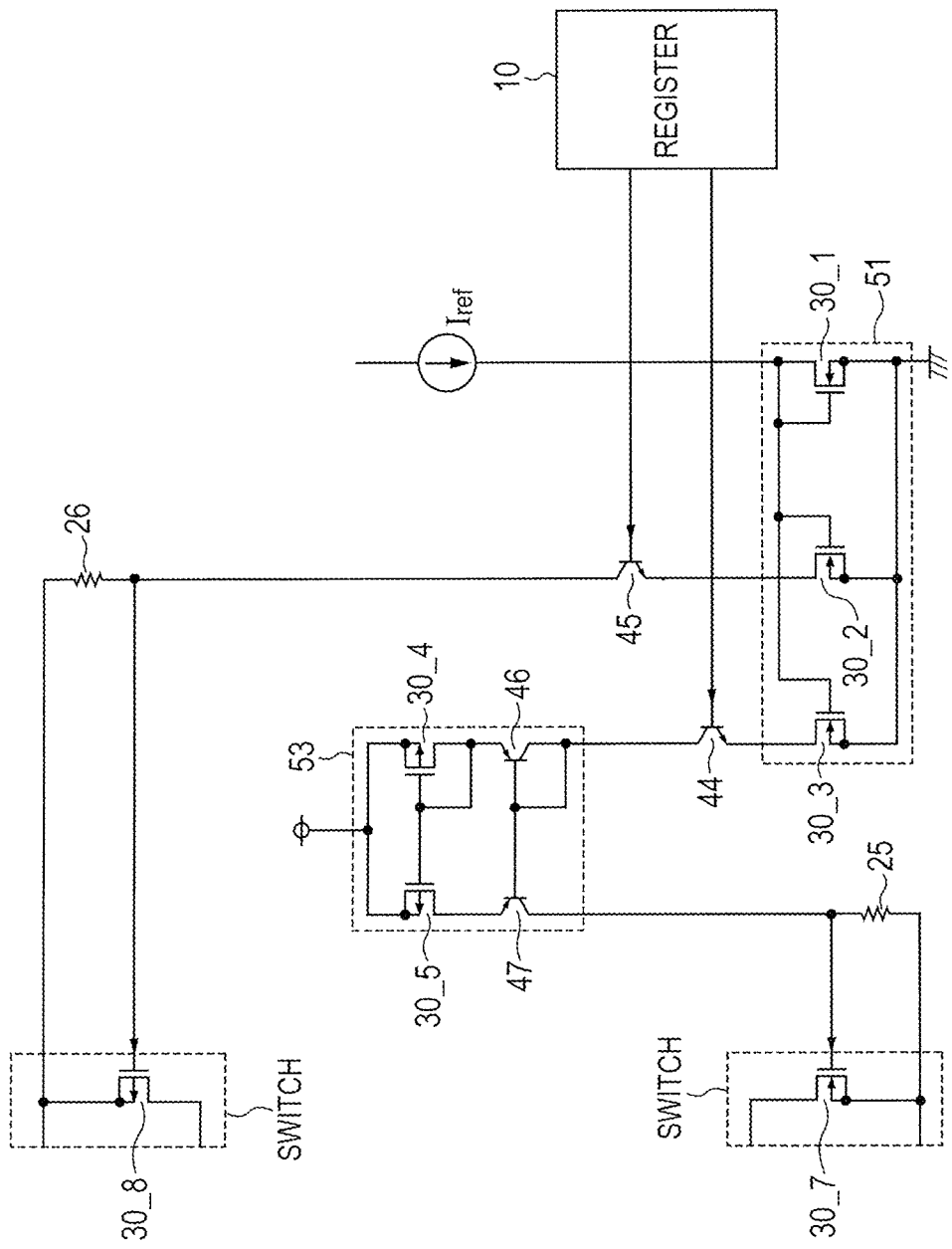
FIG. 7 is an explanatory diagram illustrating an example in which the up-convert level shifter circuit of the battery voltage monitoring IC is comprised of a high withstand voltage bipolar transistor.

FIG. 7 is an explanatory diagram illustrating an example in which the up-convert level shifter circuit of the battery voltage monitoring IC is comprised of a high withstand voltage bipolar transistor.

The up-convert level shifter circuits 3, 4, and 5 convert a low-potential-side control signal (EN_$L_{TAP}$, EN_$L_{CB}$, EN_$L_{MON}$) into a high-potential-side control signal (EN_$H_{TAP}$, EN_$H_{CB}$, EN_$H_{MON}$). Each of the low-potential-side control signal and the high-potential-side control signal can employ the bus arrangement formed by 12 signal lines respectively corresponding to 12 unit cells. However, FIG. 7 illustrates an example in which two low-potential-side control signals are shifted to two high-potential-side control signals. Although not limited in particular, the low-potential-side control signals are stored in a register 10. The upper part of FIG. 7 illustrates a circuit which outputs the high-potential-side control signal for driving a switch comprised of a p-channel MOSFET 30_8. The lower part of FIG. 7 illustrates a circuit which outputs the high-potential-side control signal for driving a switch comprised of an n-channel MOSFET 30_7. Bipolar transistors 44, 45, 46, and 47 are high withstand voltage transistors, and MOSFETs are ordinary low withstand voltage MOSFETs.

A current mirror 51 comprised of MOSFETs 30_1, 30_2, and 30_3 is provided. The current mirror 51 is supplied with a reference current $I_{ref}$ and outputs a current at a predetermined magnification of the reference current to the bipolar transistor 45 via the MOSFET 30_2, and to the bipolar transistor 44 via the MOSFET 30_3, respectively.

A base of the bipolar transistor 45 is supplied with one of the low-potential-side control signals, and a collector thereof is coupled to a resistor 26 and a gate of the p-channel MOSFET 30_8 which configures a switch. This signal line corresponds to the high-potential-side control signal. The other side of the resistor 26 is coupled to a source of the p-channel MOSFET 30_8 which configures the switch. This signal line corresponds to one of the terminals $C_0$-$C_{12}$ illustrated in FIG. 2.

The bipolar transistor 45 performs the on-off control of the output current of the current mirror 51 according to the value of the low-potential-side control signal. When controlled to ON, the bipolar transistor 45 makes the output current of the current mirror 51 flow through the resistor 26. Accordingly, a voltage drop is generated across the resistor 26, and a high-potential-side control signal is generated, which is based on the potential of one of the terminals $C_0$-$C_{12}$ as a reference potential. Since the high-potential-side control signal is lower than the terminal voltage, it is suitable for control of the switch comprised of the p-channel MOSFET 30_8.

A base of bipolar transistor 44 is supplied with the other of the low-potential-side control signals, and a collector thereof is coupled to a current mirror 53. The output of the current mirror 53 is coupled to a resistor 25 and a gate of an n-channel MOSFET 30_7 which configures a switch. This signal line corresponds to the high-potential-side control signal. The other side of the resistor 25 is coupled to a source of the n-channel MOSFET 30_7 which configures the switch. This signal line corresponds to one of the terminals $C_0$-$C_{12}$ illustrated in FIG. 2.

The bipolar transistor 44 performs the on-off control of the output current of the current mirror 51 according to the value of the low-potential-side control signal. When controlled to ON, the current further mirrored by the current mirror 53 flows through the resistor 25. Accordingly, a voltage drop is generated across the resistor 25, and a high-potential-side control signal is generated, which is based on the potential of one of the terminals $C_0$-$C_{12}$ as a reference potential. Since the high-potential-side control signal is higher than the terminal voltage, it is suitable for control of the switch comprised of the n-channel MOSFET 30_7.

Proper use of the p-channel MOSFET 30_8 and the n-channel MOSFET 30_7 in configuring a switch is the same as the case explained in Embodiment 6. Therefore, the explanation thereof is omitted.

When the withstand voltage of a bipolar transistor is comparatively low, a bipolar transistor of the same kind as the bipolar transistor 43 illustrated in FIG. 5 is inserted in the middle of the input-output current path of a current mirror; accordingly, the withstand voltage can be distributed.

Embodiment 8

<A Battery Voltage Monitoring Device>

Figure 8:
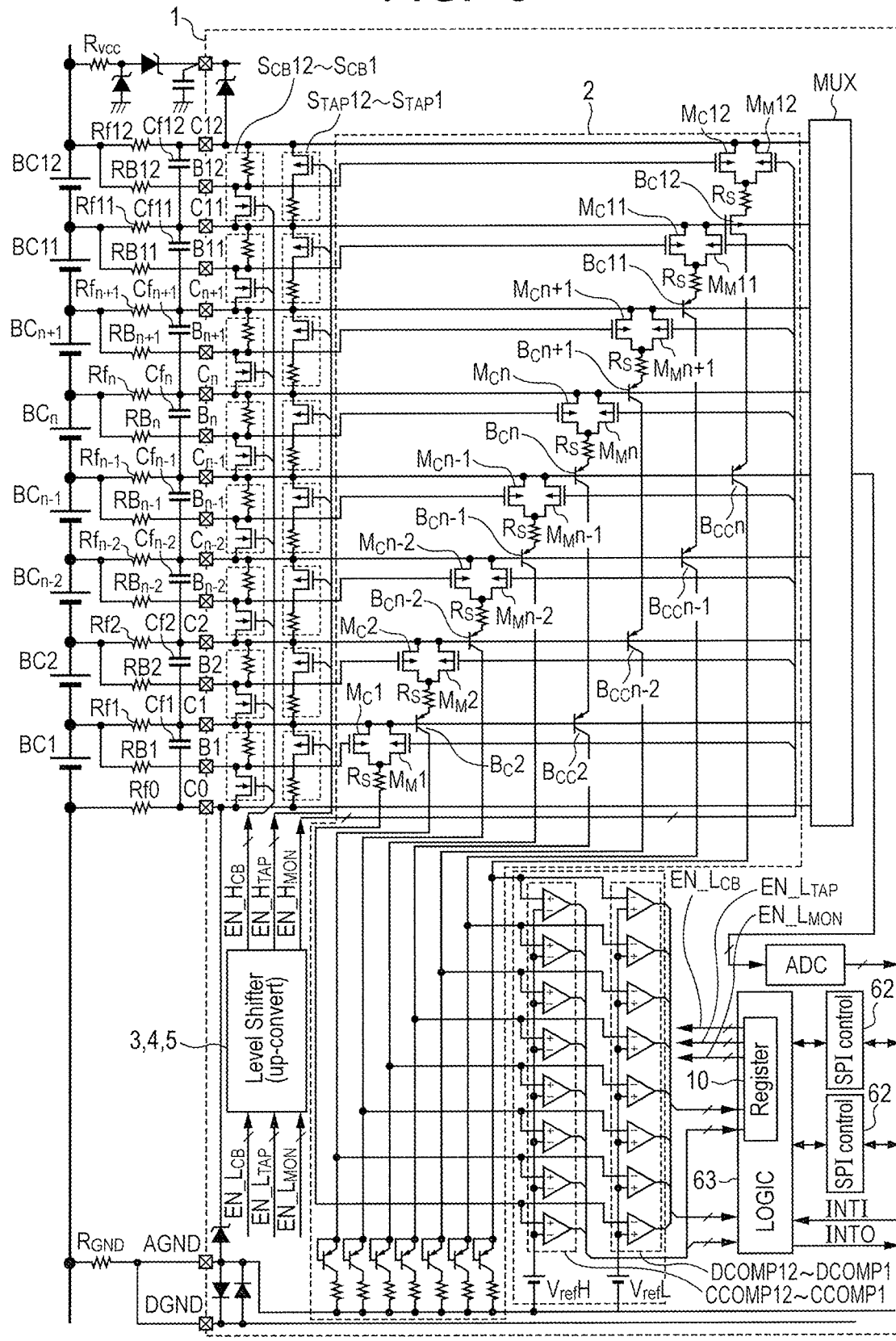
FIG. 8 is a more detailed configuration diagram of the battery voltage monitoring IC.
Figure 9:
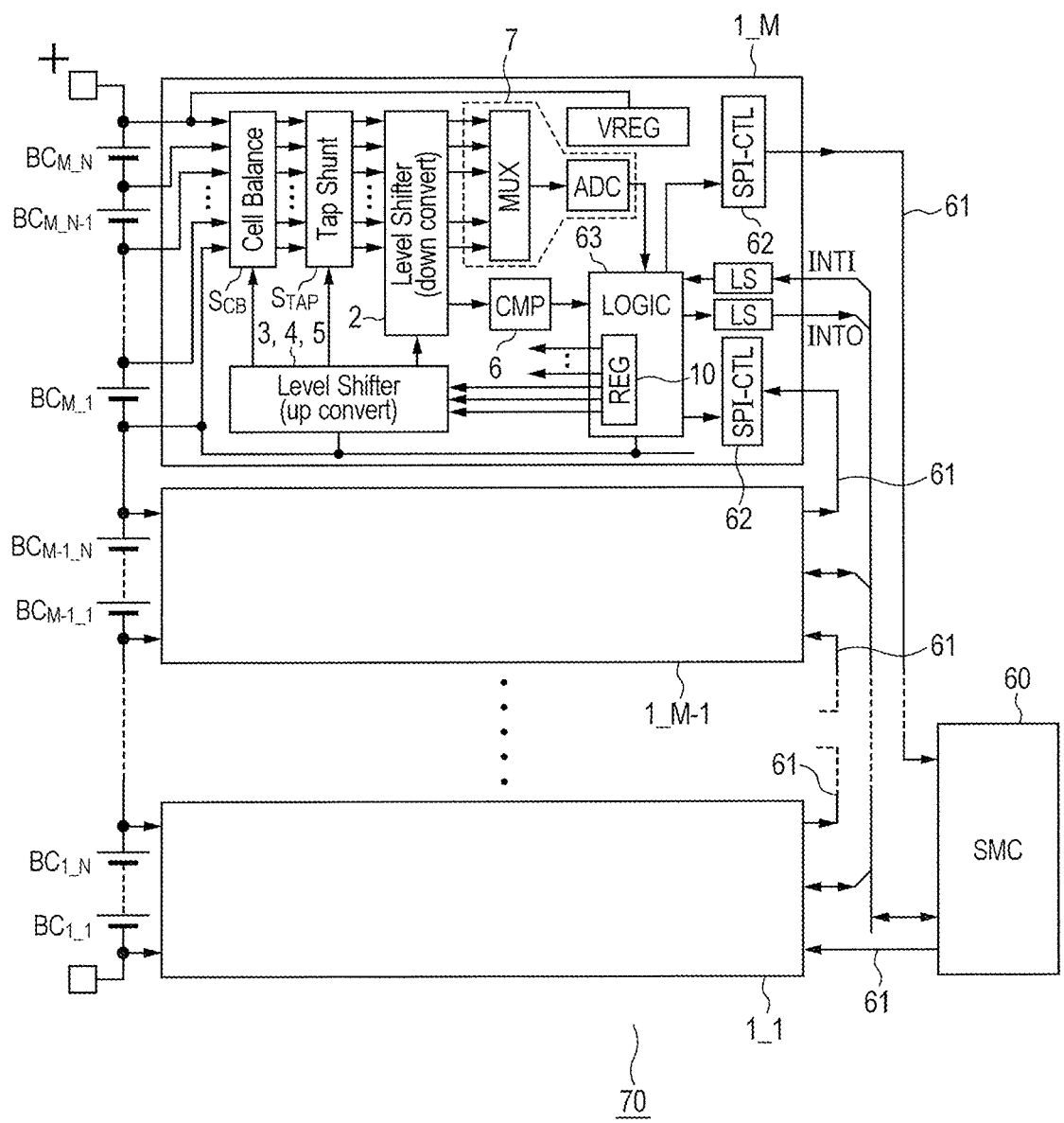
FIG. 9 is a drawing illustrating a configuration of principal parts of the battery voltage monitoring device.

FIG. 8 is a more detailed configuration diagram of the battery voltage monitoring IC, and FIG. 9 is a drawing illustrating a configuration of principal parts of the battery voltage monitoring device. As the configuration of the battery voltage monitoring IC, various modifications as exemplified in Embodiments 1-7 and the combination of those are possible. Therefore, what is illustrated in FIG. 8 is only one of the examples.

The battery voltage monitoring IC (semiconductor device) 1 is comprised of terminals $C_0$-$C_{12}$ and terminals $B_0$-$B_{12}$. The terminals $C_0$-$C_{12}$ and the terminals $B_0$-$B_{12}$ are coupled to each of the nodes coupled in series across both poles of plural unit cells $BC_1$-$BC_{12}$ which are series-coupled in multi-stage for configuring an assembled battery. The battery voltage monitoring IC 1 is provided with the cell voltage measurement function for measuring a cell voltage of each of the unit cells $BC_1$-$BC_{12}$ and the cell balance function for keeping the cell voltage approximately equal. The battery voltage monitoring IC 1 is further provided with, as the fault monitoring function, the function for detecting overcharge/overdischarge, the function for detecting tap disengagement which is disconnection between each node of the series-coupled unit cells and the terminals $C_0$-$C_{12}$, and the function for detecting fault of a discharge switch which realizes the cell balance function.

In order to realize the cell voltage measurement function, both poles of the unit cells $BC_1$-$BC_{12}$ are coupled, via the terminals $C_0$-$C_{12}$, to a voltage measurement circuit 7 which is comprised of a multiplexer MUX and an analog-to-digital converter ADC. The multiplexer MUX selects sequentially the unit cells $BC_1$-$BC_{12}$. The analog-to-digital converter ADC measures each cell voltage, converts the each cell voltage to digital values and outputs the converted digital values. The converted digital values may be stored in a register 10.

The cell voltage of each of the unit cells $BC_1$-$BC_{12}$ is coupled to the voltage measurement circuit 7 and also coupled to a comparator circuit 6 via a down-convert level shifter circuit 2, in parallel. The down-convert level shifter circuit 2 illustrated in FIG. 8 is configured by use of bipolar transistors $BC_2$-$BC_{12}$ and $B_{CC}2$-$B_{CC}n$, as illustrated in FIG. 5. The bipolar transistors $B_{CC}2$-$B_{CC}n$ are inserted in order to distribute the withstand voltage. The comparator circuit 6 is comprised of a high-voltage-side comparator circuit (CCOMP1-CCOMP12) which compares the cell voltage shifted to the low potential side by a down-convert level shifter circuit 2, with a high-voltage-side reference voltage ($V_{ref}H$), and a low-voltage-side comparator circuit (DCOMP1-DCOMP12) which compares the cell voltage shifted to the low potential side, with a low-voltage-side reference voltage ($V_{ref}L$). In the case of a lithium-ion battery for example, it is possible for the high-voltage-side comparator circuit (CCOMP1-CCOMP12) to detect the overcharge state of the unit cells $BC_1$-$BC_{12}$, by setting the high-voltage-side reference voltage ($V_{ref}H$) to 4.5V, and it is possible for the low-voltage-side comparator circuit (DCOMP1-DCOMP12) to detect the overdischarge state of the unit cells $BC_1$-$BC_{12}$, by setting the low-voltage-side reference voltage ($V_{ref}L$) to 2V. The comparison result can be stored in the register 10.

In order to realize the function for detecting the tap disengagement, switches $S_{TAP}12$-$S_{TAP}1$ each of which short-circuits the adjoining terminals via a resistor are provided at all the terminals $C_0$-$C_{12}$. These correspond to the resistor 21 and the switch 11 illustrated in FIG. 1. When the low-voltage-side comparator circuit (DCOMP1-DCOMP12) detects that the cell voltage in the state where the switches $S_{TAP}12$-$S_{TAP}1$ are closed is lower than the low-voltage-side reference voltage ($V_{ref}L$), the fault of the tap disengagement is detected. In the case of the tap disengagement, the cell voltage measured becomes 0V; therefore, the low-voltage-side reference voltage ($V_{ref}L$) may be the same voltage as the reference voltage for the overdischarge detection. That is, the down-convert level shifter circuit 2 and the comparator circuit 6 for the overdischarge detection can be employed without change in order to realize the function for detecting the tap disengagement. The detected result of the tap disengagement can be stored in the register 10.

In order to realize the cell balance function, the battery voltage monitoring IC (semiconductor device) 1 is provided with terminals $B_0$-$B_{12}$ in addition to the terminals $C_0$-$C_{12}$, and switches $S_{CB}12$-$S_{CB}1$ for short-circuiting the terminal $B_n$ and the terminal $C_{n-1}$. It is possible to employ a cell balance circuit of other types than ones illustrated in FIGS.

3A, 3B, and 3C. By discharging selectively a unit cell whose cell voltage is higher than the other unit cells, it is possible to control the cell voltage of all the unit cells so as to be approximately equal. In order to detect the fault of the switches $S_{CB}12$-$S_{CB}1$, each of the switches $S_{CB}12$-$S_{CB}1$ is provided with a pull-up resistor and is coupled to a switch 14 which performs the on-off control of the down-convert level shifter circuit 2. The down-convert level shifter circuit 2 is further provided with a switch 13 in parallel with the switch 14. In FIG. 8, the switch 14 is comprised of MOSFETs $M_c12$-$M_c1$, and the switch 13 is comprised of MOSFETs $M_M12$-$M_M1$. The fault detection operation of the switch is the same as explained in Embodiment 2; therefore, the explanation thereof is omitted.

The high-potential-side control signals $EN\_H_{TAP}$, $EN\_H_{CB}$, and $EN\_H_{MON}$, which control respectively the switches $S_{TAP}12$-$S_{TAP}1$, the switches $S_{CB}12$-$S_{CB}1$, and the MOSFETs $M_M12$-$M_M1$ configuring the switch 13, are generated by level-shifting the potential of the low-potential-side control signals $EN\_L_{TAP}$, $EN\_L_{CB}$, and $EN\_L_{MON}$ by the up-convert level shifter circuits 3, 4, and 5. It is possible to employ the circuit illustrated in Embodiments 6 or 7 for the circuit of the up-convert level shifters 3, 4, and 5. The low-potential-side control signals $EN\_L_{TAP}$, $EN\_L_{CB}$, and $EN\_L_{MON}$ are stored in the register 10.

The battery voltage monitoring IC 1 is further provided with a logic circuit 63 including the register 10, and an SPI (Serial Peripheral Interface) control circuit as a communication interface 62. The register 10 can be accessed from the exterior via the communication interface 62. The logic circuit 63 can receive an interrupt INTI from the exterior, and can issue an interrupt INTO to the exterior. For example, when abnormal conditions are detected by the fault monitoring function, such as the fault detection, not only the abnormal conditions are stored in the register 10, but the interrupt INTO is issued to notify the abnormal conditions more positively.

FIG. 9 illustrates a configuration of principal parts of a battery voltage monitoring device 70. Plural unit cells which configure an assembled battery are divided into groups of series-coupled plural unit cells, and the battery voltage monitoring ICs 1_1-1_M are coupled to each group. The battery voltage monitoring device 70 is further provided with a battery system controller 60. The battery system controller 60 is coupled to a communication interface 62 of the battery voltage monitoring ICs 1_1-1_M through a communication path 61 which is formed by use of a daisy chain, for example. It is possible to control the operation of each of the battery voltage monitoring ICs 1_1-1_M, by writing control information in a register 10 thereof, and it is possible to collect the measured data of a cell voltage, or the state data indicative of the existence or nonexistence of fault or abnormal conditions, by reading the information stored in the register 10.

Interrupt signals INTI and INTO of each of the battery voltage monitoring ICs 1_1-1_M are coupled to the battery system controller 60 via a level shifter. The level shifter may be provided internally or externally in each of the battery voltage monitoring ICs 1_1-1_M. The voltage of the assembled battery comprised of plural unit cells series-coupled in multi-stage may amount to as high as several hundred volts. Therefore, in that case, the cost may be suppressed low by absorbing the potential difference by use of an external level shifter, rather than requiring each of the battery voltage monitoring ICs 1_1-1_M for that magnitude of withstand voltage.

Figure 10:
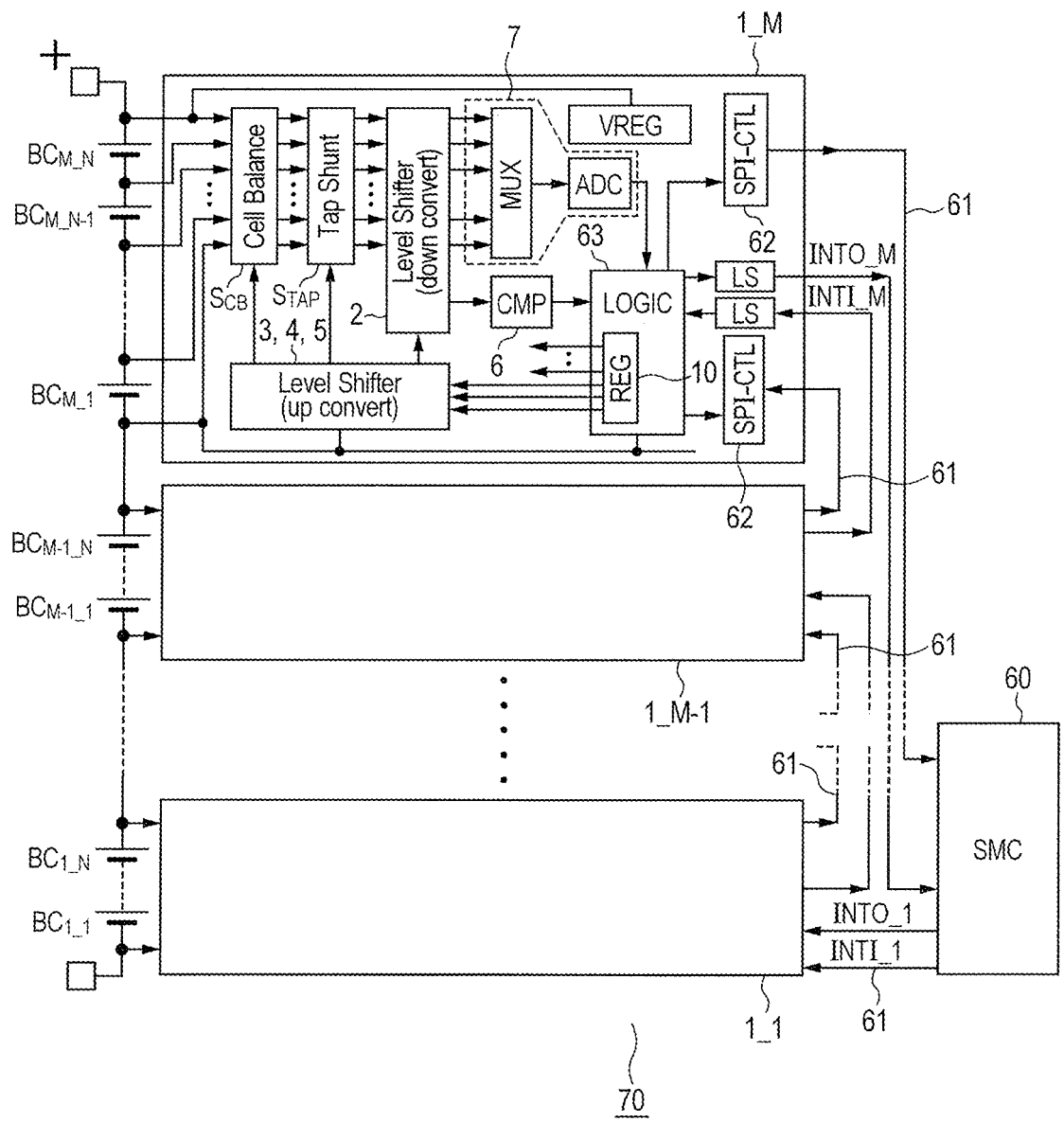
FIG. 10 is a drawing illustrating a configuration of principal parts of a battery voltage monitoring device according to another embodiment.

FIG. 10 illustrates a configuration of principal parts of a battery voltage monitoring device 70 according to another embodiment. The difference from the battery voltage monitoring device 70 illustrated in FIG. 9 lies in the point that the interrupt signals INTI and INTO of each of the battery voltage monitoring ICs 1_1-1_M are coupled to the battery system controller 60 by use of a daisy chain. The battery voltage monitoring IC 1_1 is supplied with an interrupt signal INTI_1 from the battery system controller 60 and outputs an interrupt signal INTO_1 to the battery voltage monitoring IC 1_2. The interrupt signal is transmitted sequentially after that, and the battery voltage monitoring IC 1_M is supplied with an interrupt signal INTI_M from the battery voltage monitoring IC 1_M−1, and outputs an interrupt signal INTO_M to the battery system controller 60. As is the case with the communication interface 62, by transferring the interrupt signal sequentially, the communication of the interrupt signal is established between each of the battery voltage monitoring ICs 1_1-1_M and the battery system controller 60.

When not only the interrupt signal but also the communication path 61 are coupled by use of a daisy chain, except for the coupling between the battery system controller 60 and each of the battery voltage monitoring IC 1_M of the top end and the battery voltage monitoring IC 1_1 of the bottom end, all the other coupling are with the adjacent battery voltage monitoring ICs. Therefore, the withstand voltage required for the interrupt input-output terminal of each of the battery voltage monitoring ICs 1_1-1_M−1 is allowed to be low. On the other hand, when there exists fault in the middle of transmission of an interrupt signal and the transmission is suspended, there exists a possibility that the interrupt signal cannot be transmitted to the battery system controller 60, even if the interrupt signal is issued by the normal battery voltage monitoring IC.

In the transmission by the common bus illustrated in FIG. 9, even if one battery voltage monitoring IC 1 in the middle of the transmission is under the fault of an interrupt signal, when it is an open fault, the transmission of the interrupt signal from other battery voltage monitoring ICs 1 will not be impeded. On the other hand, all the battery voltage monitoring ICs 1 including one arranged at that potential are coupled to the battery system controller 60; therefore, it is necessary to provide level shifters.

As described above, the invention accomplished by the present inventors has been concretely explained based on the embodiments. However, it cannot be overemphasized that the present invention is not restricted to the embodiments, and it can be changed variously in the range which does not deviate from the gist.

For example, the battery voltage monitoring IC which is applied to an assembled battery comprised of unit cells (battery cells) series-coupled in multi-stage has been explained. It is effective to employ secondary cells, such as a lithium-ion battery, a nickel-hydrogen battery, and a fuel cell, as the unit cell and to apply the battery voltage monitoring IC in order to monitor the charge and discharge state of the secondary cells. It is also effective to apply the battery voltage monitoring IC as the voltage monitoring device for an assembled battery comprised of series-coupled primary cells, and for the power source in which large capacity capacitors, such as electric double layer capacitors and lithium-ion capacitors, etc. are series-coupled in multi-stage.

What is claimed is:

1. A method of measuring voltage of each of a plurality of unit cells series-coupled in multi-stage and configuring an assembled battery, the method using at least one semiconductor device,
   wherein the semiconductor device comprises:
      a first terminal to be coupled to a first node which is one electrode of a unit cell and is coupled to another unit cell in the unit cells; and
      a second terminal to be coupled to a second node which is the other electrode of the unit cell and is coupled to another unit cell,
   wherein the method comprises:
      measuring an inter-terminal voltage between the first terminal and the second terminal by a voltage measurement circuit;
      converting the inter-terminal voltage into a low-potential-side inter-terminal voltage by a first level shifter circuit;
      comparing the low-potential-side inter-terminal voltage with a predetermined reference voltage by a comparator circuit;
      converting a low-potential-side shunt control signal into a high-potential-side shunt control signal by a second level shifter circuit; and
      short-circuiting the first terminal and the second terminal via a first resistor, on the basis of the high-potential-side shunt control signal by a first switch,
   wherein the semiconductor device further comprises:
      a third terminal to be coupled to the first node; and
      a second resistor coupled between the first terminal and the third terminal,
   wherein the method further comprises:
      converting a low-potential-side sense enable signal into a high-potential-side sense enable signal by a third level shifter circuit;
      converting a low-potential-side cell balance enable signal into a high-potential-side cell balance enable signal by a fourth level shifter circuit; and
      short-circuiting the third terminal and the second terminal, on the basis of the high-potential-side cell balance enable signal by a third switch, and
   wherein the first level shifter circuit comprises:
      a voltage-to-current converter circuit operable to convert the inter-terminal voltage into a current value corresponding to the inter-terminal voltage;
      a current-to-voltage converter circuit operable to convert the current value into a low-potential-side inter-terminal voltage corresponding to the current value;
      a second switch operable to control operation of the voltage-to-current converter circuit, on the basis of the high-potential-side sense enable signal; and
      a fourth switch operable to control operation of the voltage-to-current converter circuit, on the basis of a potential of the third terminal, in parallel with the second switch.

2. The method of claim 1, wherein
   the semiconductor device further comprises
      a fourth terminal to be coupled to the second node.

3. A method of monitoring battery voltage, the method using at least one battery voltage monitoring device,
   wherein the device comprises:
      a plurality of voltage measurement units provided for each group of a plurality of unit cells series-coupled in multi-stage for configuring an assembled battery; and
      a battery system controller coupled to the voltage measurement units,
   wherein each of the voltage measurement units is comprised of a semiconductor device,
   wherein the semiconductor device comprises:
      a first terminal to be coupled to a first node which is one electrode of a unit cell and is coupled to another unit cell in the unit cells; and
      a second terminal to be coupled to a second node which is the other electrode of the unit cell and is coupled to another unit cell;
   wherein the method comprises:
      measuring an inter-terminal voltage between the first terminal and the second terminal by a voltage measurement circuit;
      converting the inter-terminal voltage into a low-potential-side inter-terminal voltage by a first level shifter circuit;
      comparing the low-potential-side inter-terminal voltage with a predetermined reference voltage by a comparator circuit;
      converting a low-potential-side shunt control signal into a high-potential-side shunt control signal by a second level shifter circuit; and
      short-circuiting the first terminal and the second terminal via a first resistor, on the basis of the high-potential-side shunt control signal by a first switch,
   wherein the semiconductor device further comprises:
      a third terminal to be coupled to the first node; and
      a second resistor coupled between the first terminal and the third terminal,
   wherein the method further comprises:
      converting a low-potential-side sense enable signal into a high-potential-side sense enable signal by a third level shifter circuit;
      converting a low-potential-side cell balance enable signal into a high-potential-side cell balance enable signal by a fourth level shifter circuit; and
      short-circuiting the third terminal and the second terminal, on the basis of the high-potential-side cell balance enable signal by a third switch,
   wherein the first level shifter circuit comprises:
      a voltage-to-current converter circuit;
      a current-to-voltage converter circuit;
      a second switch; and
      a fourth switch, and
   wherein the method further comprises:
      converting the inter-terminal voltage into a current value corresponding to the inter-terminal voltage by the voltage-to-current converter circuit;
      converting the current value into a low-potential-side inter-terminal voltage corresponding to the current value by the current-to-voltage converter circuit;
      controlling operation of the voltage-to-current converter circuit, on the basis of the high-potential-side sense enable signal by the second switch; and
      controlling operation of the voltage-to-current converter circuit by the fourth switch, on the basis of a potential of the third terminal, in parallel with the second switch.

4. The method of claim 3, wherein
   the semiconductor device further comprises
      a fourth terminal to be coupled to the second node.

* * * * *